United States Patent
Chin et al.

(10) Patent No.: US 11,658,649 B2
(45) Date of Patent: May 23, 2023

(54) PIN STATE CONFIGURATION CIRCUIT AND CONFIGURATION METHOD, AND ELECTRONIC DEVICE

(71) Applicant: HUAWEI DIGITAL POWER TECHNOLOGIES CO., LTD., Shenzhen (CN)

(72) Inventors: Ken Chin, Shenzhen (CN); Yuanjun Liu, Shenzhen (CN); Guiping Zhang, Dongguan (CN); Shanglin Mo, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/717,265

(22) Filed: Apr. 11, 2022

(65) Prior Publication Data

US 2022/0376686 A1 Nov. 24, 2022

(30) Foreign Application Priority Data

May 21, 2021 (CN) .......................... 202110558493.0

(51) Int. Cl.
*H03K 5/24* (2006.01)
(52) U.S. Cl.
CPC ........................ *H03K 5/24* (2013.01)
(58) Field of Classification Search
CPC .................. G01R 17/00; G01R 19/165; G01R 19/16566; H03K 5/153; H03K 5/24
(Continued)

(56) References Cited

U.S. PATENT DOCUMENTS 10,277,228 B1  4/2019  Buch
11,126,211 B1 * 9/2021  Chuang .................... G05F 1/46
(Continued)

FOREIGN PATENT DOCUMENTS

CN    101109775 A    1/2008
CN    101615903 A    12/2009
(Continued)

OTHER PUBLICATIONS

International Search Report and Written Opinion issued in PCT/CN2021/123626, dated Feb. 17, 2022, 10 pages.
(Continued)

*Primary Examiner* — Quan Tra

(57) ABSTRACT

A pin state configuration circuit, a method for configuring pin states and an electronic device for configuring pin states are provided. The pin state configuration circuit includes a configured resistor load, a voltage sampling unit, and a comparator. The voltage sampling unit supplies a reference voltage to the configured resistor load by using a first or second configuration pin, and respectively samples voltages of the first and second configuration pins. The comparator calculates a first voltage ratio based on the voltage of the first configuration pin and the voltage of the second configuration pin, calculates a second voltage ratio based on the voltage of the first configuration pin and the voltage of the second configuration pin, and determines a corresponding pin configuration state based on the first and second voltage ratios. In this way, N×N pin configuration states may be obtained by configuring two configuration pins.

15 Claims, 27 Drawing Sheets

(58) Field of Classification Search
USPC .......................................................... 327/77
See application file for complete search history.

(56) References Cited

U.S. PATENT DOCUMENTS

| | | | | |
|---|---|---|---|---|
| 11,448,539 | B2* | 9/2022 | Losio | ...................... G01F 1/698 |
| 2007/0126473 | A1* | 6/2007 | Await | ................. H03K 19/1732 |
| | | | | 326/33 |
| 2008/0278346 | A1 | 11/2008 | Eftimie et al. | |
| 2010/0315037 | A1* | 12/2010 | Aiura | .................... H02J 7/0047 |
| | | | | 320/107 |
| 2011/0018587 | A1 | 1/2011 | Li | |
| 2014/0145627 | A1 | 5/2014 | Jung et al. | |
| 2020/0166981 | A1* | 5/2020 | Takahashi | ................. G05F 1/10 |
| 2020/0312809 | A1 | 10/2020 | Lin et al. | |

FOREIGN PATENT DOCUMENTS

| | | | |
|---|---|---|---|
| CN | 204350272 U | 5/2015 | |
| CN | 113472326 A | 10/2021 | |

OTHER PUBLICATIONS

Extended European Search Report issued in EP22166141.6, dated Feb. 16, 2023, 9 pages.

* cited by examiner

PIN STATE CONFIGURATION CIRCUIT AND CONFIGURATION METHOD, AND ELECTRONIC DEVICE

CROSS-REFERENCE TO RELATED APPLICATION

This application claims priority to Chinese Patent Application No. 202110558493.0, filed on May 21, 2021, which is hereby incorporated by reference in its entirety.

TECHNICAL FIELD

This application relates to the field of electronic technologies, and in particular, to a pin state configuration circuit and configuration method and an electronic device.

BACKGROUND

In design of an integrated circuit (IC) chip, a pin is configured to transmit input and output signals of the chip, including a data signal, a clock signal, a power signal, and the like. To implement more functions on a same chip and improve cost-effectiveness of the chip, a pin state configuration function is provided during manufacturing of most chips. According to different pin state configurations, a chip may be in different working states, to implement different functions or performance Pin state configuration is generally performed in the following manners: A first manner is to configure different voltages for a pin, where different voltages represent different pin states. A second manner is to modify content of a register unit inside a chip by using an external processor, so as to implement pin state configuration.

FIG. 1 is a schematic diagram of a structure of a pin state configuration circuit in a related technology. As shown in FIG. 1, the configuration circuit implements mode configuration based on a resistor voltage division policy. A voltage of a mode configuration pin MOD between VCC and GND is configured through voltage division by using resistors R01 and R02. In an IC mode detection phase, a voltage value on the mode configuration pin MOD at a start moment is read and latched, and then a corresponding mode state is determined based on the read voltage value. Therefore, different modes may be configured by configuring different R01 and R02. However, in this technology, two pins are required to configure a set of states. In addition, after IC mode configuration is completed, the resistors R01 and R02 have continuous power losses. Especially, when a plurality of pins are required for configuration, a relatively large loss occurs.

FIG. 2 is a schematic diagram of a working principle of pin state configuration in another related technology. As shown in FIG. 2, a resistor R01 is an external resistor connected to a chip, and a resistor R02 is a variable resistor inside the chip. In a configuration process, a resistance value of the resistor R02 is changed, and a resistance value of the resistor R01 is compared with the resistance value of the resistor R02, to determine a corresponding mode. Therefore, different modes may be configured by configuring different R01. In this technology, during mode configuration, a set of configuration states is implemented based on a single pin MOD. However, due to different characteristics of the internal and external resistors, a comparison precision is low. As a result, a quantity of states that can be configured is reduced.

SUMMARY

This application provides a pin state configuration circuit and configuration method and an electronic device, to increase a quantity of states that can be configured.

According to a first aspect, an embodiment of this application provides a pin state configuration circuit, including a configured resistor load, a voltage sampling unit, and a comparator. The configured resistor load is configured to connect to a first configuration pin and a second configuration pin of a chip. The voltage sampling unit may supply a second reference voltage to the configured resistor load by using the first configuration pin or the second configuration pin, and respectively sample a voltage of the first configuration pin and a voltage of the second configuration pin. The comparator may calculate a first voltage ratio based on the voltage of the first configuration pin and the voltage of the second configuration pin that are sampled by the voltage sampling unit when the second reference voltage is supplied to the configured resistor load by using the first configuration pin, calculate a second voltage ratio based on the voltage of the first configuration pin and the voltage of the second configuration pin that are sampled by the voltage sampling unit when the second reference voltage is supplied to the configured resistor load by using the second configuration pin, and determine a corresponding pin configuration state based on the first voltage ratio and the second voltage ratio.

The configuration circuit may obtain first voltage ratios of N states and second voltage ratios of the N states by configuring resistors in the configured resistor load. Therefore, N×N states may be configured by combining the first voltage ratio and the second voltage ratio. That is, N×N pin configuration states may be determined based on the first voltage ratio and the second voltage ratio, so that N×N mode states may be configured for the chip. In addition, when the configuration circuit does not work, the configured resistor load does not work. Therefore, there is no power loss.

In a specific implementation, the configured resistor load may include: a configurable first resistor, a configurable second resistor, and a configurable third resistor. A first terminal of the first resistor is connected to a first reference voltage, and a second terminal of the first resistor is connected to the first configuration pin; a first terminal of the second resistor is connected to the first reference voltage, and a second terminal of the second resistor is connected to the second configuration pin; and the third resistor is connected between the second terminal of the first resistor and the second terminal of the second resistor. The voltage sampling unit may supply the second reference voltage to the configured resistor load by using the first configuration pin or the second configuration pin. When the second reference voltage Vcc is supplied to the configured resistor load by using the first configuration pin, the voltage vmod1 of the first configuration pin and the voltage vmod2 of the second configuration pin are respectively sampled. In this case, the voltage of the first configuration pin is vmod1=Vcc, and the voltage of the second configuration pin is vmod2=[R2/(R2+R3)]Vcc. When the second reference voltage is supplied to the configured resistor load by using the second configuration pin, the voltage vmod1 of the first configuration pin and the voltage vmod2 of the second configuration pin are respectively sampled. In this case, the voltage of the second configuration pin is vmod2=Vcc, and the voltage of the first configuration pin is vmod1=[R1/(R1+R3)]Vcc. The comparator may include a voltage ratio calculation unit and a state machine unit. The voltage ratio calculation unit may calculate a first voltage ratio based on the voltage of the first configuration pin and the voltage of the second configuration pin that are sampled by the voltage sampling unit when the second reference voltage is supplied to the configured resistor load by using the first configuration pin, and calculate a second voltage ratio based on the voltage of the first configuration pin and the voltage of the second configuration pin that are sampled by the voltage sampling unit when the second reference voltage is supplied to the configured resistor load by using the second configuration pin. Therefore, the state machine unit may determine a corresponding pin configuration state based on the first voltage ratio and the second voltage ratio.

Therefore, in embodiments of this application, first voltage ratios of N states may be obtained by configuring voltage division by configuring a resistance ratio of the second resistor and the third resistor, and second voltage ratios of N states may be obtained by configuring voltage division by configuring a resistance ratio of the first resistor and the third resistor. In addition, in embodiments of this application, the configuration is performed based on a resistor voltage division ratio, so that a precision of a state value can be improved.

For example, the voltage sampling unit may include a voltage supply circuit and a voltage sampling circuit. The voltage supply circuit is configured to supply the second reference voltage to the first configuration pin and the second configuration pin in a time division manner, to supply the second reference voltage to the configured resistor load by using the first configuration pin or the second configuration pin. The voltage sampling circuit is configured to respectively sample the voltage of the first configuration pin and the voltage of the second configuration pin when the voltage supply circuit supplies the second reference voltage to the first configuration pin; and respectively sample the voltage of the first configuration pin and the voltage of the second configuration pin when the voltage supply circuit supplies the second reference voltage to the second configuration pin.

In an embodiment, a first capacitor may be further added to the configured resistor load, and the first capacitor and the third resistor are disposed in parallel. The comparator is further configured to detect a charging time or a discharging time of the first capacitor when the voltage sampling unit supplies the second reference voltage to the configured resistor load. The state machine unit is configured to determine a corresponding pin configuration state based on the first voltage ratio, the second voltage ratio, and the detected charging time or discharging time of the first capacitor. M states may be obtained by configuring a capacitance value of the first capacitor. Therefore, a corresponding pin configuration state may be determined by combining the charging time or the discharging time of the first capacitor, the first voltage ratio, and the second voltage ratio, and N×N×M states may be configured.

In another embodiment, a first capacitor and a second capacitor may be further added to the configured resistor load. The first capacitor and the first resistor are disposed in parallel, and the second capacitor and the second resistor are disposed in parallel. The comparator is further configured to respectively detect a charging time or a discharging time of the first capacitor and a charging time or a discharging time of the second capacitor when the voltage sampling unit supplies the second reference voltage to the configured resistor load. The state machine unit is configured to determine a corresponding pin configuration state based on the first voltage ratio, the second voltage ratio, and the charging time or the discharging time of the first capacitor and the charging time or the discharging time of the second capacitor. M states may be obtained by configuring a capacitance value of the first capacitor, and M states may be obtained by configuring a capacitance value of the second capacitor. Therefore, a corresponding pin configuration state may be determined by combining the charging time or the discharging time of the first capacitor, the charging time or the discharging time of the second capacitor, the first voltage ratio, and the second voltage ratio, and N×N×M×M states may be configured.

In still another embodiment, a configuration pin may be added to the chip, that is, the chip has three configuration pins, which are the first configuration pin, the second configuration pin, and a third configuration pin, respectively. The configured resistor load may further include a configurable fourth resistor and a configurable fifth resistor. A first terminal of the fourth resistor is configured to connect to the first reference voltage, and a second terminal of the fourth resistor is configured to connect to the third configuration pin; and the fifth resistor is connected between the second terminal of the fourth resistor and the second terminal of the second resistor. The voltage sampling unit is further configured to sample a voltage of the third configuration pin when the second reference voltage is supplied to the configured resistor load by using the second configuration pin. The voltage ratio calculation unit further needs to calculate a third voltage ratio based on the voltage of the second configuration pin and the voltage of the third configuration pin that are sampled by the voltage sampling unit when the second reference voltage is supplied to the configured resistor load by using the second configuration pin. The state machine unit is configured to determine a corresponding pin configuration state based on the first voltage ratio, the second voltage ratio, and the third voltage ratio. Therefore, a corresponding pin configuration state may be determined by combining the first voltage ratio, the second voltage ratio, and the third voltage ratio, and N×N×N states may be configured.

In a specific implementation, when the second reference voltage is supplied to the configured resistor load by using the first configuration pin, the voltage of the first configuration pin and the voltage of the second configuration pin are respectively sampled. When the second reference voltage is supplied to the configured resistor load by using the second configuration pin, the voltage of the first configuration pin, the voltage of the second configuration pin, and the voltage of the third configuration pin are respectively sampled.

Further, when the chip has three configuration pins, a first capacitor and a second capacitor may be further added to the configured resistor load. The first capacitor and the third resistor are disposed in parallel, and the second capacitor and the fifth resistor are disposed in parallel. The comparator is further configured to respectively detect a charging time or a discharging time of the first capacitor and a charging time or a discharging time of the second capacitor when the voltage sampling unit supplies the second reference voltage to the configured resistor load. The state machine unit is configured to determine a corresponding pin configuration state based on the first voltage ratio, the second voltage ratio, the third voltage ratio, the charging time or the discharging time of the first capacitor, and the charging time or the discharging time of the second capacitor. M states may be obtained by configuring a capacitance value of the first capacitor, and M states may be obtained by configuring a capacitance value of the second capacitor. Therefore, a corresponding pin configuration state may be determined by combining the charging time or the discharging time of the first capacitor, the charging time or the discharging time of the second capacitor, the first voltage ratio, the second voltage ratio, and the third voltage ratio, and N×N×N×M×M states may be configured.

According to a second aspect, an embodiment of this application further provides another pin state configuration circuit, including a configured resistor load, a voltage sampling unit, and a comparator. The configured resistor load is configured to connect to a first configuration pin, a second configuration pin, and a third configuration pin of a chip. For example, the configured resistor load may include a configurable first resistor, a configurable second resistor, a configurable third resistor, a configurable fourth resistor, and a configurable fifth resistor. A first terminal of the first resistor is connected to a first reference voltage, for example, grounded, and a second terminal of the first resistor is connected to the first configuration pin; a first terminal of the second resistor is connected to the first reference voltage, for example, grounded, and a second terminal of the second resistor is connected to the second configuration pin; the third resistor is connected between the second terminal of the first resistor and the second terminal of the second resistor; a first terminal of the fourth resistor is configured to connect to the first reference voltage, and a second terminal of the fourth resistor is configured to connect to the third configuration pin; and the fifth resistor is connected between the second terminal of the fourth resistor and the second terminal of the second resistor.

The voltage sampling unit may supply a second reference voltage to the configured resistor load by using the first configuration pin, the second configuration pin, or the third configuration pin, and respectively sample a voltage of the first configuration pin, a voltage of the second configuration pin, and a voltage of the third configuration pin. In a specific implementation, for example, a resistance value of the third resistor is configured to be equal to a resistance value of the fifth resistor, and when the second reference voltage is supplied to the configured resistor load by using the second configuration pin, the voltage of the first configuration pin, the voltage of the second configuration pin, and the voltage of the third configuration pin are respectively sampled. When the second reference voltage is supplied to the configured resistor load by using the first configuration pin and the third configuration pin simultaneously, the voltage of the first configuration pin, the voltage of the second configuration pin, and the voltage of the third configuration pin are respectively sampled.

The voltage ratio calculation unit may be configured to calculate a first voltage ratio and a third voltage ratio based on the voltage of the first configuration pin, the voltage of the second configuration pin, and the voltage of the third configuration pin that are sampled by the voltage sampling unit when the second reference voltage is supplied to the configured resistor load by using the second configuration pin; and calculate a second voltage ratio based on the voltage of the first configuration pin, the voltage of the second configuration pin, and the voltage of the third configuration pin that are sampled by the voltage sampling unit when the second reference voltage is supplied to the configured resistor load by using the third configuration pin and the first configuration pin simultaneously.

For example, the first voltage ratio may be calculated based on the voltage of the first configuration pin and the voltage of the second configuration pin that are sampled when the second reference voltage is supplied to the configured resistor load by using the second configuration pin, and the third voltage ratio may be calculated based on the voltage of the third configuration pin and the voltage of the second configuration pin. For example, the first voltage ratio may be equal to a ratio of the voltage of the first configuration pin to the voltage of the second configuration pin, which are sampled when the second reference voltage is supplied to the configured resistor load by using the second configuration pin. The third voltage ratio may be equal to a ratio of the voltage of the third configuration pin to the voltage of the second configuration pin, which are sampled when the second reference voltage is supplied to the configured resistor load by using the second configuration pin. The second voltage ratio may be calculated based on the voltage of the first configuration pin and the voltage of the second configuration pin or the voltage of the third configuration pin and the voltage of the second configuration pin that are sampled when the second reference voltage is supplied to the configured resistor load by using the first configuration pin and the third configuration pin simultaneously. For example, the second voltage ratio may be equal to a ratio of the voltage of the second configuration pin to the voltage of the first configuration pin or the voltage of the third configuration pin, which are sampled when the second reference voltage is supplied to the configured resistor load by using the first configuration pin and the third configuration pin simultaneously.

The state machine unit may be configured to determine a corresponding pin configuration state based on the first voltage ratio, the second voltage ratio, and the third voltage ratio. Therefore, a corresponding pin configuration state may be determined by combining the first voltage ratio, the second voltage ratio, and the third voltage ratio, and N×N×N states may be configured.

Further, a first capacitor and a second capacitor may be further added to the configured resistor load. The first capacitor and the third resistor are disposed in parallel, and the second capacitor and the fifth resistor are disposed in parallel. A time detection unit further needs to be disposed in the comparator. The time detection unit respectively detects a charging time or a discharging time of the first capacitor and a charging time or a discharging time of the second capacitor when the voltage sampling unit supplies the second reference voltage to the configured resistor load. The state machine unit is configured to determine a corresponding pin configuration state based on the first voltage ratio, the second voltage ratio, the third voltage ratio, the charging time or the discharging time of the first capacitor, and the charging time or the discharging time of the second capacitor. M states may be obtained by configuring a capacitance value of the first capacitor, and M states may be obtained by configuring a capacitance value of the second capacitor. Therefore, a corresponding pin configuration state may be determined by combining the charging time or the discharging time of the first capacitor, the charging time or the discharging time of the second capacitor, the first voltage ratio, the second voltage ratio, and the third voltage ratio, and N×N×N×M×M states may be configured.

According to a third aspect, an embodiment of this application further provides an electronic device, including a chip and the pin state configuration circuit according to the first aspect or the implementations of the first aspect or the pin state configuration circuit according to the second aspect or the implementations of the second aspect. The configuration circuit is configured to connect to configuration pins of the chip. Because a problem resolution principle of the electronic device is similar to that of the state configuration circuit, for implementation of the electronic device, refer to implementation of the state configuration circuit. Details are not repeated.

According to a fourth aspect, an embodiment of this application further provides a pin state configuration method, including the following steps: First, a configured resistor load is connected to a first configuration pin and a second configuration pin of a chip. Then, a second reference voltage is supplied to the configured resistor load by using the first configuration pin or the second configuration pin, and a voltage of the first configuration pin and a voltage of the second configuration pin are respectively sampled. Moreover, a first voltage ratio is calculated based on the voltage of the first configuration pin and the voltage of the second configuration pin that are sampled when the second reference voltage is supplied to the configured resistor load by using the first configuration pin, and a second voltage ratio is calculated based on the voltage of the first configuration pin and the voltage of the second configuration pin that are sampled when the second reference voltage is supplied to the configured resistor load by using the second configuration pin. Finally, a corresponding pin configuration state is determined based on the first voltage ratio and the second voltage ratio.

For example, the configured resistor load may include: a configurable first resistor, a configurable second resistor, and a configurable third resistor. A first terminal of the first resistor is connected to a first reference voltage, and a second terminal of the first resistor is connected to the first configuration pin; a first terminal of the second resistor is connected to the first reference voltage, and a second terminal of the second resistor is connected to the second configuration pin; and the third resistor is connected between the second terminal of the first resistor and the second terminal of the second resistor.

For example, the supplying a second reference voltage to the configured resistor load by using the first configuration pin or the second configuration pin, and respectively sampling a voltage of the first configuration pin and a voltage of the second configuration pin may include: supplying the second reference voltage to the first configuration pin and the second configuration pin in a time division manner, to supply the second reference voltage to the configured resistor load by using the first configuration pin or the second configuration pin; respectively sampling the voltage of the first configuration pin and the voltage of the second configuration pin when the second reference voltage is supplied to the first configuration pin; and respectively sampling the voltage of the first configuration pin and the voltage of the second configuration pin when the second reference voltage is supplied to the second configuration pin.

Optionally, in an embodiment, the configured resistor load further includes a first capacitor connected in parallel to the third resistor; and the configuration method may specifically include: First, the configured resistor load is connected to the first configuration pin and the second configuration pin of the chip. Then, the second reference voltage may be supplied to the configured resistor load by using the first configuration pin or the second configuration pin, a charging time or a discharging time of the first capacitor may be detected, and a voltage of the first configuration pin and a voltage of the second configuration pin may be respectively sampled. Next, a first voltage ratio is calculated based on the voltage of the first configuration pin and the voltage of the second configuration pin that are sampled when the second reference voltage is supplied to the configured resistor load by using the first configuration pin, and a second voltage ratio is calculated based on the voltage of the first configuration pin and the voltage of the second configuration pin that are sampled when the second reference voltage is supplied to the configured resistor load by using the second configuration pin. Finally, a corresponding pin configuration state may be determined based on the charging time or the discharging time of the first capacitor, the first voltage ratio, and the second voltage ratio. M states may be obtained by configuring a capacitance value of the first capacitor. Therefore, a corresponding pin configuration state may be determined by combining the charging time or the discharging time of the first capacitor, the first voltage ratio, and the second voltage ratio, and N×N×M states may be configured.

Optionally, in another embodiment, the configured resistor load further includes a first capacitor connected in parallel to the first resistor and a second capacitor connected in parallel to the second resistor; and the configuration method may specifically include: First, the configured resistor load may be connected to the first configuration pin and the second configuration pin of the chip. Then, the second reference voltage may be supplied to the configured resistor load by using the first configuration pin or the second configuration pin, a charging time or a discharging time of the first capacitor and a charging time or a discharging time of the second capacitor may be respectively detected, and a voltage of the first configuration pin and a voltage of the second configuration pin may be respectively sampled. Next, a first voltage ratio is calculated based on the voltage of the first configuration pin and the voltage of the second configuration pin that are sampled when the second reference voltage is supplied to the configured resistor load by using the first configuration pin, and a second voltage ratio is calculated based on the voltage of the first configuration pin and the voltage of the second configuration pin that are sampled when the second reference voltage is supplied to the configured resistor load by using the second configuration pin. Finally, a corresponding pin configuration state is determined based on the charging time or the discharging time of the first capacitor, the charging time or the discharging time of the second capacitor, the first voltage ratio, and the second voltage ratio. M states may be obtained by configuring a capacitance value of the first capacitor, and M states may be obtained by configuring a capacitance value of the second capacitor. Therefore, a corresponding pin configuration state may be determined by combining the charging time or the discharging time of the first capacitor, the charging time or the discharging time of the second capacitor, the first voltage ratio, and the second voltage ratio, and N×N×M×M states may be configured.

Optionally, in still another embodiment, the chip further has a third configuration pin. The configured resistor load may further include a configurable fourth resistor and a configurable fifth resistor. A first terminal of the fourth resistor is configured to connect to the first reference voltage, and a second terminal of the fourth resistor is configured to connect to the third configuration pin; and the fifth resistor is connected between the second terminal of the fourth resistor and the second terminal of the second resistor. The configuration method may specifically include: First, the configured resistor load is connected to the first configuration pin, the second configuration pin, and the third configuration pin of the chip. Then, the second reference voltage is supplied to the configured resistor load by using the first configuration pin or the second configuration pin, and a voltage of the first configuration pin, a voltage of the second configuration pin, and a voltage of the third configuration pin are respectively sampled. Next, a first voltage ratio is calculated based on the voltage of the first configuration pin and the voltage of the second configuration pin that are sampled when the second reference voltage is supplied to the configured resistor load by using the first configuration pin, and a second voltage ratio is calculated based on the voltage of the first configuration pin and the voltage of the second configuration pin that are sampled when the second reference voltage is supplied to the configured resistor load by using the second configuration pin. A third voltage ratio is calculated based on the voltage of the second configuration pin and the voltage of the third configuration pin that are sampled when the second reference voltage is supplied to the configured resistor load by using the second configuration pin. Finally, a corresponding pin configuration state is determined based on the first voltage ratio, the second voltage ratio, and the third voltage ratio. Therefore, a corresponding pin configuration state may be determined by combining the first voltage ratio, the second voltage ratio, and the third voltage ratio, and N×N×N states may be configured.

In a specific implementation, when the second reference voltage is supplied to the configured resistor load by using the first configuration pin, the voltage of the first configuration pin and the voltage of the second configuration pin may be respectively sampled. When the second reference voltage is supplied to the configured resistor load by using the second configuration pin, the voltage of the first configuration pin, the voltage of the second configuration pin, and the voltage of the third configuration pin may be respectively sampled. The first voltage ratio may be equal to a ratio of the voltage of the second configuration pin to the voltage of the first configuration pin, which are sampled when the second reference voltage is supplied to the configured resistor load by using the first configuration pin. The second voltage ratio may be equal to a ratio of the voltage of the first configuration pin to the voltage of the second configuration pin, which are sampled when the second reference voltage is supplied to the configured resistor load by using the second configuration pin. The third voltage ratio may be equal to a ratio of the voltage of the second configuration pin to the voltage of the third configuration pin, which are sampled when the second reference voltage is supplied to the configured resistor load by using the second configuration pin.

Certainly, in a specific implementation, the first voltage ratio may alternatively be calculated based on the voltage of the second configuration pin and the voltage of the third configuration pin that are respectively sampled when the second reference voltage is supplied to the configured resistor load by using the third configuration pin. For example, the first voltage ratio may be equal to a ratio of the voltage of the second configuration pin to the voltage of the third configuration pin.

Further, the configured resistor load may further include a first capacitor connected in parallel to the third resistor and a second capacitor connected in parallel to the fifth resistor; and the configuration method may further include: respectively detecting a charging time or a discharging time of the first capacitor and a charging time or a discharging time of the second capacitor when the second reference voltage is supplied to the configured resistor load. The determining a corresponding pin configuration state based on the first voltage ratio, the second voltage ratio, and the third voltage ratio may specifically include: determining a corresponding pin configuration state based on the first voltage ratio, the second voltage ratio, the third voltage ratio, the charging time or the discharging time of the first capacitor, and the charging time or the discharging time of the second capacitor. M states may be obtained by configuring a capacitance value of the first capacitor, and M states may be obtained by configuring a capacitance value of the second capacitor. Therefore, a corresponding pin configuration state may be determined by combining the charging time or the discharging time of the first capacitor, the charging time or the discharging time of the second capacitor, the first voltage ratio, the second voltage ratio, and the third voltage ratio, and N×N×N×M×M states may be configured.

According to a fifth aspect, an embodiment of this application further provides a pin state configuration method. The configuration method may specifically include: First, a configured resistor load may be connected to a first configuration pin, a second configuration pin, and a third configuration pin of a chip. Then, a second reference voltage may be supplied to the configured resistor load by using the first configuration pin, the second configuration pin, or the third configuration pin, and a voltage of the first configuration pin, a voltage of the second configuration pin, and a voltage of the third configuration pin may be respectively sampled. Next, a first voltage ratio and a third voltage ratio are calculated based on the voltage of the first configuration pin, the voltage of the second configuration pin, and the voltage of the third configuration pin that are sampled when the second reference voltage is supplied to the configured resistor load by using the second configuration pin; and a second voltage ratio is calculated based on the voltage of the first configuration pin, the voltage of the second configuration pin, and the voltage of the third configuration pin that are sampled when the second reference voltage is supplied to the configured resistor load by using the first configuration pin and the third configuration pin simultaneously. Finally, a corresponding pin configuration state may be determined based on the first voltage ratio, the second voltage ratio, and the third voltage ratio. Therefore, N×N×N states may be configured by combining the first voltage ratio, the second voltage ratio, and the third voltage ratio. That is, N×N×N pin configuration states may be determined based on the first voltage ratio, the second voltage ratio, and the third voltage ratio, so that N×N×N mode states may be configured for the chip. In addition, when the configuration circuit does not work, the configured resistor load does not work. Therefore, there is no power loss.

For example, the configured resistor load may include a configurable first resistor, a configurable second resistor, a configurable third resistor, a configurable fourth resistor, and a configurable fifth resistor. A first terminal of the first resistor is connected to a first reference voltage, for example, grounded, and a second terminal of the first resistor is connected to the first configuration pin; a first terminal of the second resistor is connected to the first reference voltage, for example, grounded, and a second terminal of the second resistor is connected to the second configuration pin; the third resistor is connected between the second terminal of the first resistor and the second terminal of the second resistor; a first terminal of the fourth resistor is configured to connect to the first reference voltage, and a second terminal of the fourth resistor is configured to connect to the third configuration pin; and the fifth resistor is connected between the second terminal of the fourth resistor and the second terminal of the second resistor.

In a specific implementation, for example, a resistance value of the third resistor is configured to be equal to a resistance value of the fifth resistor, and when the second reference voltage is supplied to the configured resistor load by using the second configuration pin, the voltage of the first configuration pin, the voltage of the second configuration pin, and the voltage of the third configuration pin are respectively sampled. When the second reference voltage is supplied to the configured resistor load by using the first configuration pin and the third configuration pin simultaneously, the voltage of the first configuration pin, the voltage of the second configuration pin, and the voltage of the third configuration pin are respectively sampled.

For example, the first voltage ratio may be calculated based on the voltage of the first configuration pin and the voltage of the second configuration pin that are sampled when the second reference voltage is supplied to the configured resistor load by using the second configuration pin, and the third voltage ratio may be calculated based on the voltage of the third configuration pin and the voltage of the second configuration pin. For example, the first voltage ratio may be equal to a ratio of the voltage of the first configuration pin to the voltage of the second configuration pin, which are sampled when the second reference voltage is supplied to the configured resistor load by using the second configuration pin. The third voltage ratio may be equal to a ratio of the voltage of the third configuration pin to the voltage of the second configuration pin, which are sampled when the second reference voltage is supplied to the configured resistor load by using the second configuration pin. The second voltage ratio may be calculated based on the voltage of the first configuration pin and the voltage of the second configuration pin or the voltage of the third configuration pin and the voltage of the second configuration pin that are sampled when the second reference voltage is supplied to the configured resistor load by using the first configuration pin and the third configuration pin simultaneously. For example, the second voltage ratio may be equal to a ratio of the voltage of the second configuration pin to the voltage of the first configuration pin or the voltage of the third configuration pin, which are sampled when the second reference voltage is supplied to the configured resistor load by using the first configuration pin and the third configuration pin simultaneously.

Further, when the configured resistor load includes five resistors: the first resistor to the fifth resistor, the configured resistor load further includes a first capacitor connected in parallel to the third resistor and a second capacitor connected in parallel to the fifth resistor; and the configuration method may specifically include: First, the configured resistor load is connected to the first configuration pin, the second configuration pin, and the third configuration pin of the chip. Then, the second reference voltage may be supplied to the configured resistor load by using the first configuration pin, the second configuration pin, or the third configuration pin, a charging time or a discharging time of the first capacitor and a charging time or a discharging time of the second capacitor may be respectively detected, and a voltage of the first configuration pin, a voltage of the second configuration pin, and a voltage of the third configuration pin may be respectively sampled. Next, a first voltage ratio and a third voltage ratio are calculated based on the voltage of the first configuration pin, the voltage of the second configuration pin, and the voltage of the third configuration pin that are sampled when the second reference voltage is supplied to the configured resistor load by using the second configuration pin; and a second voltage ratio is calculated based on the voltage of the first configuration pin, the voltage of the second configuration pin, and the voltage of the third configuration pin that are sampled when the second reference voltage is supplied to the configured resistor load by using the first configuration pin and the third configuration pin simultaneously. Finally, a corresponding pin configuration state may be determined based on the charging time or the discharging time of the first capacitor, the charging time or the discharging time of the second capacitor, the first voltage ratio, the second voltage ratio, and the third voltage ratio. M states may be obtained by configuring a capacitance value of the first capacitor, and M states may be obtained by configuring a capacitance value of the second capacitor. Therefore, a corresponding pin configuration state may be determined by combining the charging time or the discharging time of the first capacitor, the charging time or the discharging time of the second capacitor, the first voltage ratio, the second voltage ratio, and the third voltage ratio, and N×N×N×M×M states may be configured.

DESCRIPTION OF EMBODIMENTS

Figure 1:
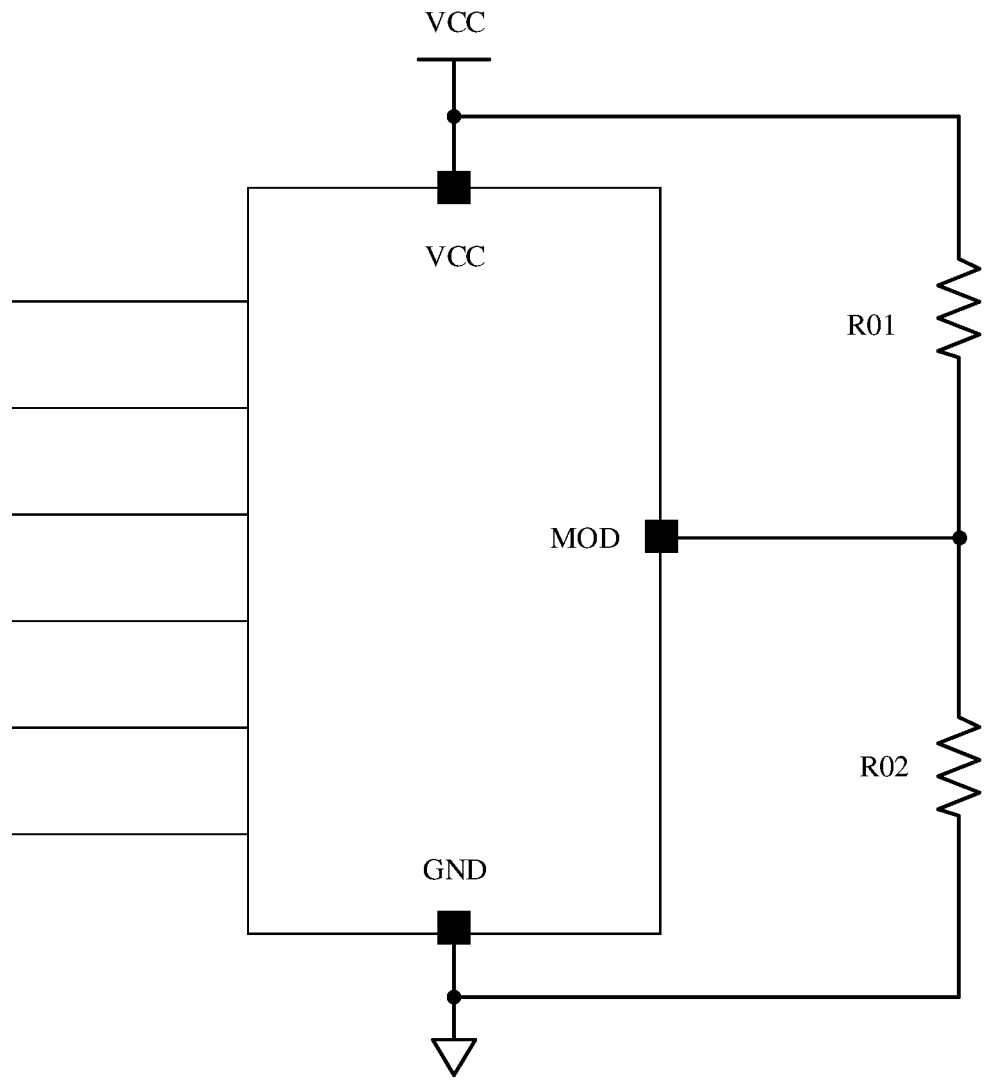
FIG. 1 is a schematic diagram of a structure of a pin state configuration circuit in a related technology.
Figure 2:
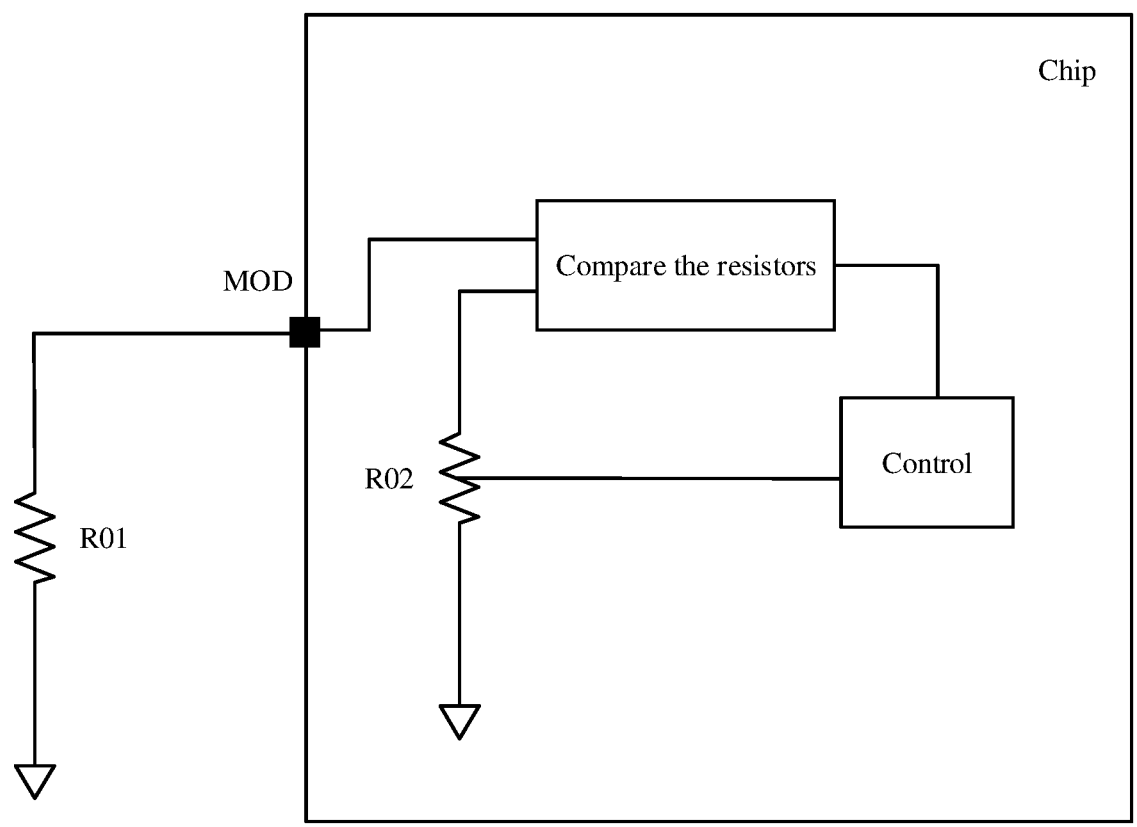
FIG. 2 is a schematic diagram of a working principle of pin state configuration in another related technology.

To make objectives, technical solutions, and advantages of this application clearer, the following further describes this application in detail with reference to accompanying drawings. However, the example implementation may be implemented in a plurality of forms, and it should not be understood as being limited to the example implementations described herein. Conversely, the implementations are provided to make this application more comprehensive and complete, and comprehensively convey the idea of the example implementations to a person skilled in the art. Like reference numerals in the diagrams represent identical or similar structures, and therefore repeated descriptions thereof are omitted. Expressions of positions and directions in this application are described by using the accompanying drawings as an example. However, changes may be made based on a requirement, and the changes fall within the protection scope of this application. The accompanying drawings in this application are merely used to illustrate a relative position relationship and do not represent a true scale.

It should be noted that specific details are set forth in the following description for full understanding of this application. However, this application can be implemented in other manners different from those described herein, and persons skilled in the art can make similar inferences without departing from the connotation of this application. Therefore, this application is not limited to the specific implementations disclosed below. Subsequent descriptions in this specification are example implementations of this application, and the descriptions are intended to describe general principles of this application, but are not intended to limit the scope of this application. The protection scope of this application is subject to the appended claims.

To facilitate understanding of a pin state configuration circuit and configuration method provided in the embodiments of this application, the following first describes an application scenario thereof.

To enable a chip to implement more functions, pin states of the chip may be configured, so that the chip is in different working states, to implement different functions or performance. The pin state configuration circuit and configuration method provided in this application may be applied to mode configuration for various chips of electronic devices. For example, an electronic device needs to configure an internal setting (for example, an address or operation mode) when the device is started, which may be implemented by configuring a pin state of a chip in the electronic device, and supplying a configuration signal used to define the internal setting to the electronic device. For example, the electronic device may be a device such as a smartphone, a smart TV, a smart TV set-top box, or a personal computer (PC). It should be noted that the configuration circuit proposed in the embodiments of this application is intended to include, but not limited to, application to these and any other suitable types of electronic devices.

To make the objectives, technical solutions, and advantages of this application clearer, the following further describes this application in detail with reference to the accompanying drawings.

Figure 3:
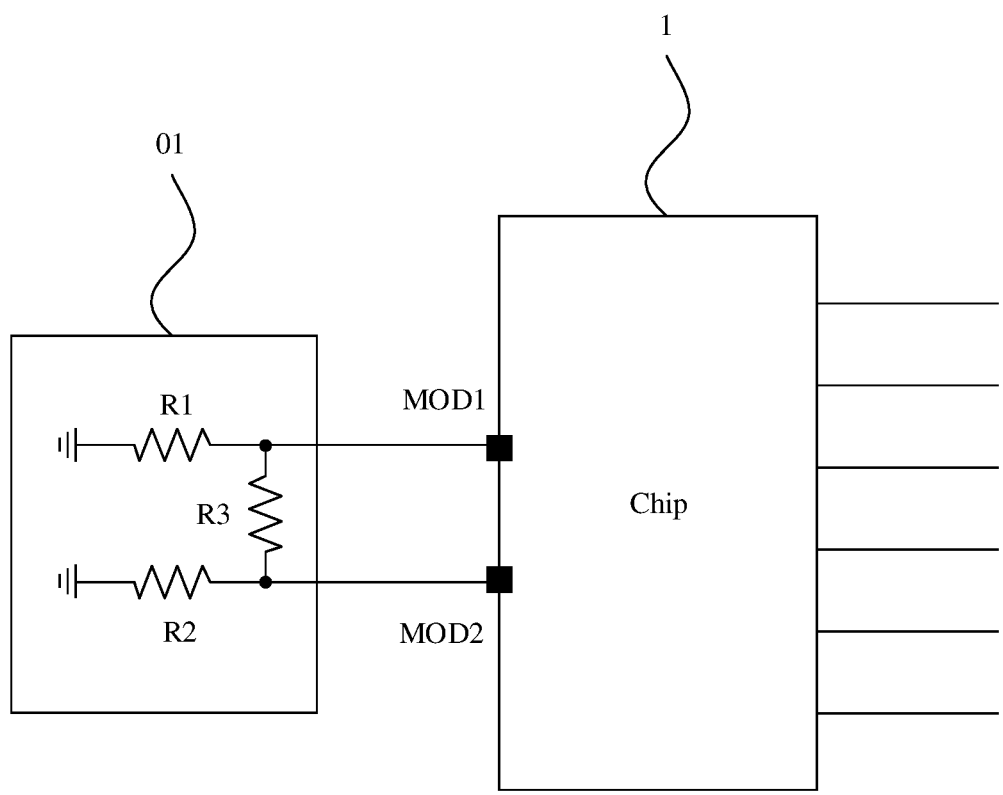
FIG. 3 is a schematic diagram of a structure of a configured resistor load according to an embodiment of this application.

FIG. 3 is a schematic diagram of a structure of a configured resistor load according to an embodiment of this application. As shown in FIG. 3, the configured resistor load 01 is configured to connect to configuration pins of a chip 1. For example, the configured resistor load 01 in FIG. 3 is connected to a first configuration pin MOD1 and a second configuration pin MOD2 of the chip 1. The configured resistor load 01 may use a π-type resistor topology structure, that is, the configured resistor load 01 includes a configurable first resistor R1, a configurable second resistor R2, and a configurable third resistor R3. A first terminal of the first resistor R1 is connected to a first reference voltage, for example, grounded, and a second terminal of the first resistor R1 is connected to the first configuration pin MOD1. A first terminal of the second resistor R2 is connected to the first reference voltage, for example, grounded, and a second terminal of the second resistor R2 is connected to the second configuration pin MOD2. The third resistor R3 is connected between the second terminal of the first resistor R1 and the second terminal of the second resistor R2. When a resistance ratio R1/R3 of the first resistor R1 and the third resistor R3 and a resistance ratio R2/R3 of the second resistor R2 and the third resistor R3 are different, a voltage ratio vmod1/vmod2 of a voltage vmod1 of the first configuration pin MOD1 to a voltage vmod2 of the second configuration pin MOD2 may be different. Therefore, different vmod1/vmod2 may be obtained by configuring R1/R3 and R2/R3, so that different pin configuration states may be obtained based on different vmod1/vmod2. A detailed description is provided below by using specific embodiments.

The resistance ratio R1/R3 of the first resistor R1 and the third resistor R3 may be configured by configuring a resistance value of the first resistor R1, or may be configured by configuring a resistance value of the third resistor R3. Similarly, the resistance ratio R2/R3 of the second resistor R2 and the third resistor R3 may be configured by configuring a resistance value of the second resistor R2, or may be configured by configuring the resistance value of the third resistor R3 when the third resistor R3 is a configurable resistor.

Embodiment 1

Figure 4:
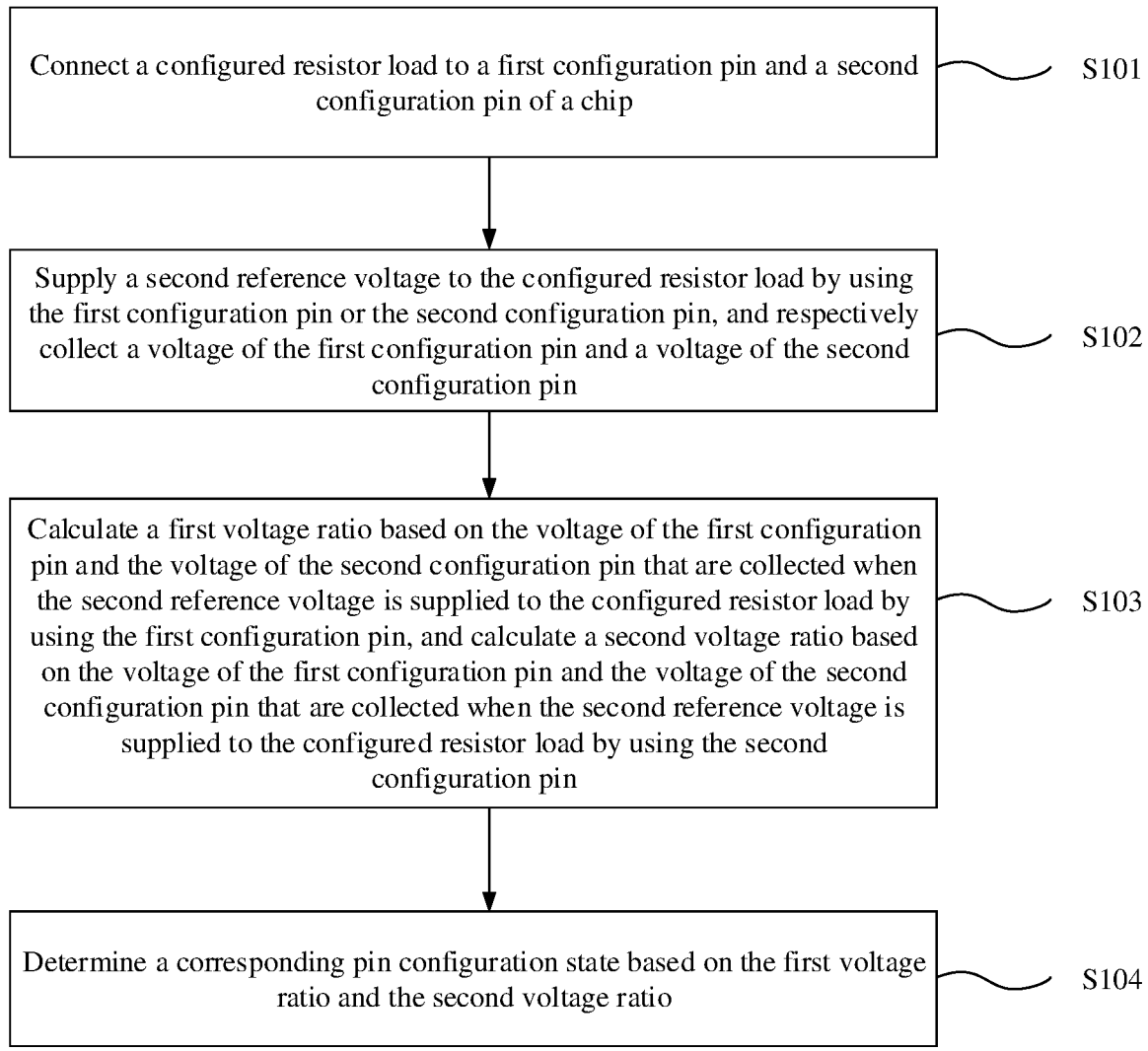
FIG. 4 is a schematic flowchart of a pin state configuration method according to an embodiment of this application.

FIG. 4 is a schematic flowchart of a pin state configuration method according to an embodiment of this application. As shown in FIG. 4, the configuration method may include the following steps.

S101. Connect a configured resistor load to a first configuration pin and a second configuration pin of a chip.

S102. Supply a second reference voltage to the configured resistor load by using the first configuration pin or the second configuration pin, and respectively sample a voltage of the first configuration pin and a voltage of the second configuration pin.

With reference to FIG. 3, when the second reference voltage Vcc is supplied to the configured resistor load 01 by using the first configuration pin MOD1, the voltage vmod1 of the first configuration pin MOD1 and the voltage vmod2 of the second configuration pin MOD2 are respectively sampled. In this case, the voltage of the first configuration pin MOD1 is vmod1=Vcc, and the voltage of the second configuration pin MOD2 is vmod2=[R2/(R2+R3)]Vcc. Therefore, a plurality of states may be configured by using vmod2 obtained by configuring voltage division by configuring a resistance ratio of the second resistor R2 and the third resistor R3. When the second reference voltage Vcc is supplied to the configured resistor load 01 by using the second configuration pin MOD2, the voltage vmod1 of the first configuration pin MOD1 and the voltage vmod2 of the second configuration pin MOD2 are respectively sampled. In this case, the voltage of the second configuration pin MOD2 is vmod2=Vcc, and the voltage of the first configuration pin MOD1 is vmod1=[R1/(R1+R3)]Vcc. Therefore, a plurality of states may be configured by using vmod1 obtained by configuring voltage division by configuring a resistance ratio of the first resistor R1 and the third resistor R3.

In a specific implementation, the second reference voltage may be supplied to the first configuration pin and the second configuration pin in a time division manner, to supply the second reference voltage to the configured resistor load by using the first configuration pin or the second configuration pin. A sequence of supplying the second reference voltage to the first configuration pin or the second configuration pin is not limited in this application, provided that it can be ensured that the second reference voltage is not supplied to the first configuration pin and the second configuration pin at the same time. For example, the second reference voltage may be first supplied to the first configuration pin, and then the second reference voltage is supplied to the second configuration pin. Alternatively, the second reference voltage is first supplied to the second configuration pin, and then the second reference voltage is supplied to the first configuration pin.

Further, the voltage of the first configuration pin and the voltage of the second configuration pin are respectively sampled when the second reference voltage is supplied to the first configuration pin. The voltage of the first configuration pin and the voltage of the second configuration pin are respectively sampled when the second reference voltage is supplied to the second configuration pin.

S103. Calculate a first voltage ratio based on the voltage of the first configuration pin and the voltage of the second configuration pin that are sampled when the second reference voltage is supplied to the configured resistor load by using the first configuration pin, and calculate a second voltage ratio based on the voltage of the first configuration pin and the voltage of the second configuration pin that are sampled when the second reference voltage is supplied to the configured resistor load by using the second configuration pin.

The first voltage ratio may be equal to a ratio of the voltage of the second configuration pin to the voltage of the first configuration pin, which are sampled when the second reference voltage is supplied to the configured resistor load by using the first configuration pin. That is, the first voltage ratio is mod_ratio1=vmod2/vmod1=R2/(R2+R3). The second voltage ratio may be equal to a ratio of the voltage of the first configuration pin to the voltage of the second configuration pin, which are sampled when the second reference voltage is supplied to the configured resistor load by using the second configuration pin. That is, the second voltage ratio is mod_ratio2=vmod1/vmod2=R1/(R1+R3).

S104. Determine a corresponding pin configuration state based on the first voltage ratio and the second voltage ratio.

For the first voltage ratio mod_ratio1=R2/(R2+R3), for example, N states may be configured by configuring the resistance ratio of the second resistor R2 and the third resistor R3, and then N states may be configured based on the first voltage ratio. Similarly, for the second voltage ratio mod_ratio2=R1/(R1+R3), for example, N states may be configured by configuring the resistance ratio of the first resistor R1 and the third resistor R3, and then N states may be configured based on the second voltage ratio. In conclusion, N×N states may be configured by combining the first voltage ratio and the second voltage ratio. That is, N×N pin configuration states may be determined based on the first voltage ratio and the second voltage ratio, so that N×N mode states may be configured for the chip.

Optionally, step S101 may be omitted. That is, in a circuit in which a connection between a pin and a configured resistor load has been established, step S102 may be directly performed, to resolve a same technical problem, and achieve a same technical effect.

Figure 5:
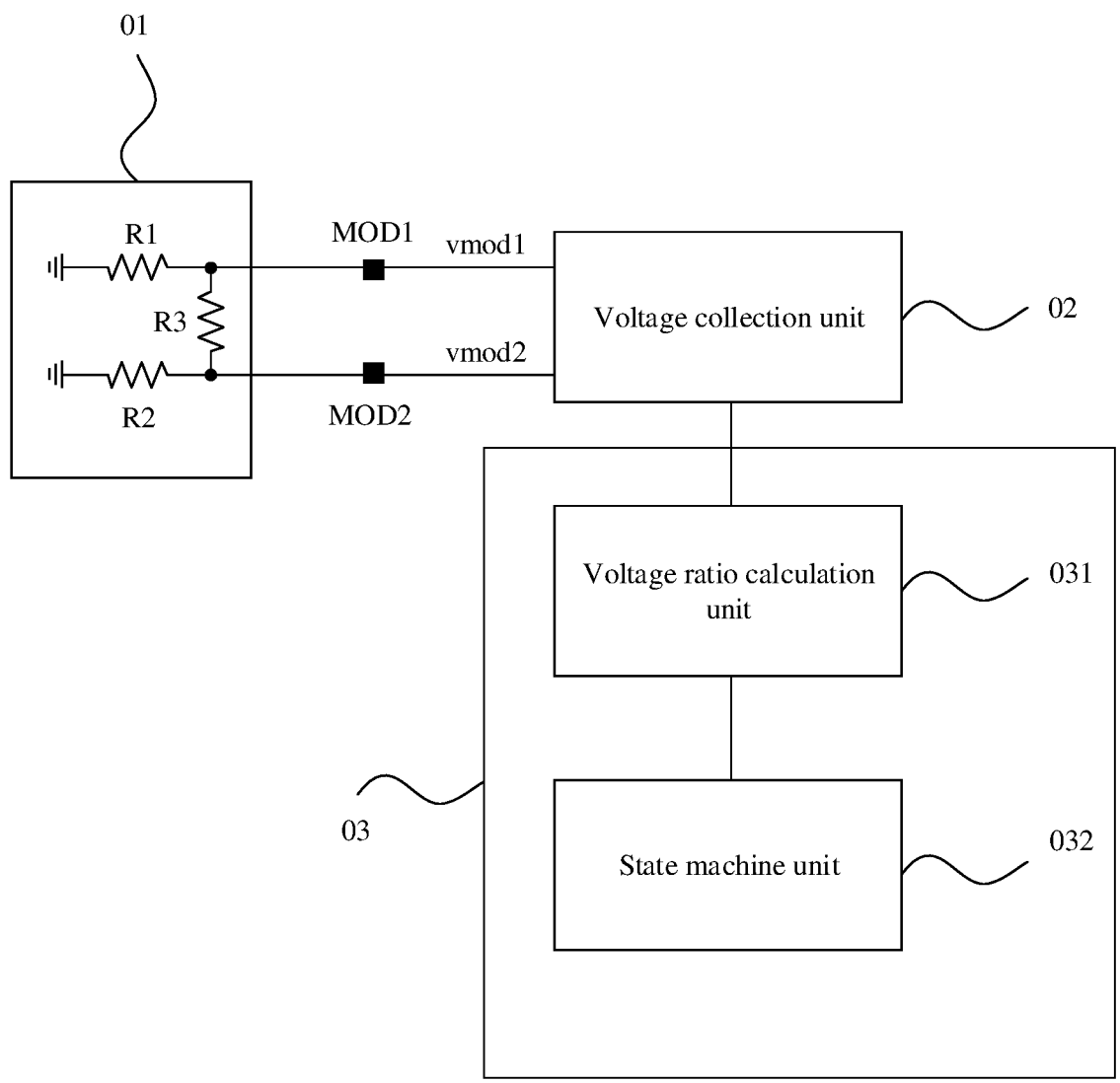
FIG. 5 is a schematic diagram of a structure of a pin state configuration circuit according to an embodiment of this application.

In a specific implementation, the configuration method may be implemented by using a configuration circuit shown in FIG. 5. Referring to FIG. 5, the configuration circuit provided in this embodiment of this application includes a configured resistor load 01, a voltage sampling unit 02, and a comparator 03. The comparator 03 may include a voltage ratio calculation unit 031 and a state machine unit 032.

For the configured resistor load 01, refer to FIG. 3, which may include a configurable first resistor R1, a configurable second resistor R2, and a configurable third resistor R3. A first terminal of the first resistor R1 is connected to a first reference voltage, and a second terminal of the first resistor R1 is connected to the first configuration pin MOD1; a first terminal of the second resistor R2 is connected to the first reference voltage, and a second terminal of the second resistor R2 is connected to the second configuration pin MOD2; and the third resistor R3 is connected between the second terminal of the first resistor R1 and the second terminal of the second resistor R2.

The voltage sampling unit 02 is configured to supply the second reference voltage Vcc to the configured resistor load 01 by using the first configuration pin MOD1 or the second configuration pin MOD2, and respectively sample the voltage vmod1 of the first configuration pin MOD1 and the voltage vmod2 of the second configuration pin MOD2.

The voltage ratio calculation unit 031 is configured to calculate the first voltage ratio based on the voltage vmod1 of the first configuration pin MOD1 and the voltage vmod2 of the second configuration pin MOD2 that are sampled by the voltage sampling unit 02 when the second reference voltage Vcc is supplied to the configured resistor load 01 by using the first configuration pin MOD1, and calculate the second voltage ratio based on the voltage vmod1 of the first configuration pin MOD1 and the voltage vmod2 of the second configuration pin MOD2 that are sampled by the voltage sampling unit 02 when the second reference voltage Vcc is supplied to the configured resistor load 01 by using the second configuration pin MOD2.

The state machine unit 032 is configured to determine the corresponding pin configuration state based on the first voltage ratio and the second voltage ratio.

Figure 6:
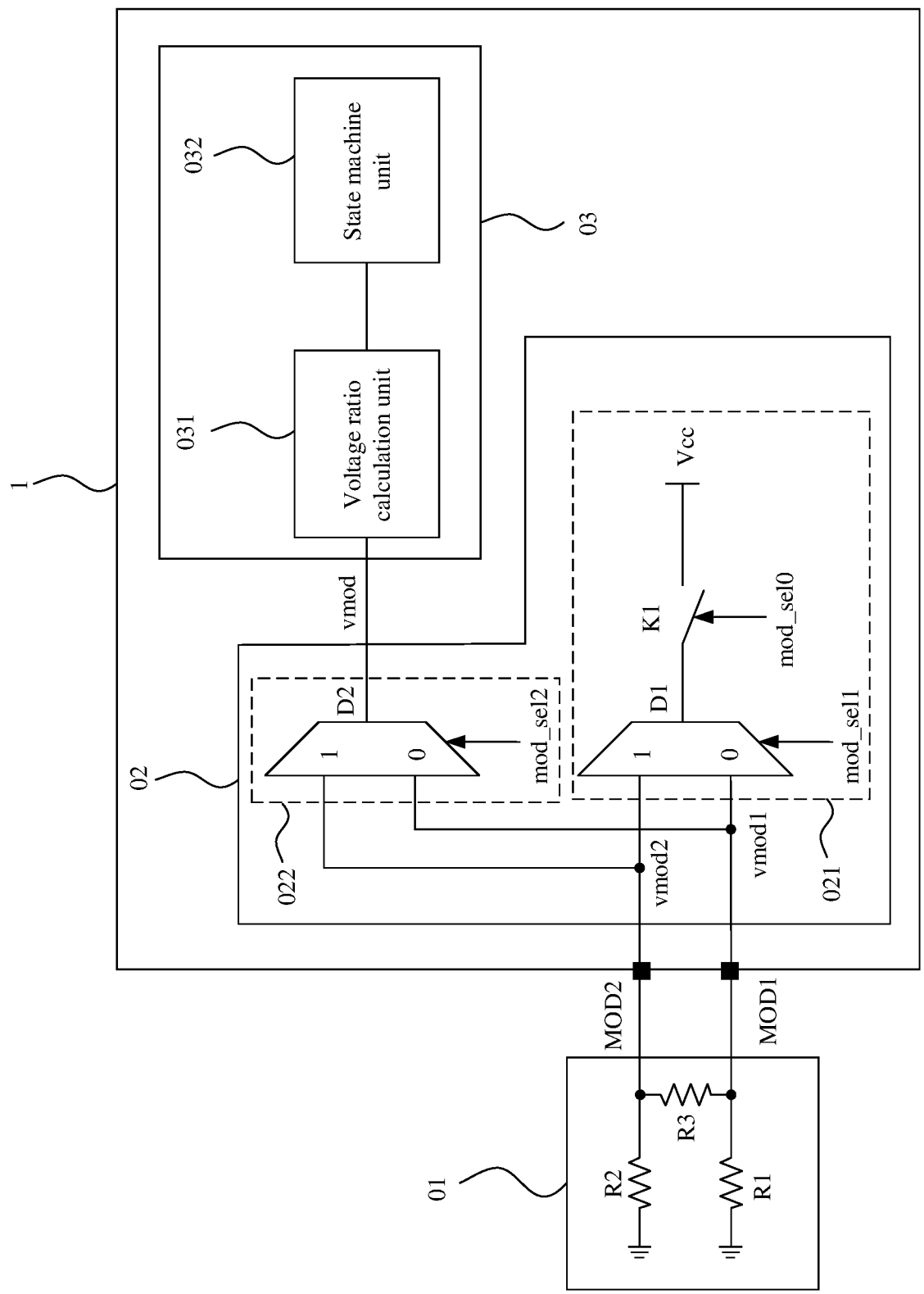
FIG. 6 is a schematic diagram of a structure of another pin state configuration circuit according to an embodiment of this application.

In an example embodiment, as shown in FIG. 6, the voltage sampling unit 02 and the comparator 03 may be disposed in the chip 1, and the configured resistor load 01 may be disposed independently of the chip 1. When a mode state of the chip needs to be configured, the configured resistor load 01 is connected to the configuration pins of the chip 1.

For example, as shown in FIG. 6, the voltage sampling unit 02 may include a voltage supply circuit 021 and a voltage sampling circuit 022. The voltage supply circuit 021 is configured to supply the second reference voltage Vcc to the first configuration pin MOD1 and the second configuration pin MOD2 in a time division manner, to supply the second reference voltage Vcc to the configured resistor load 01 by using the first configuration pin MOD1 or the second configuration pin MOD2. The voltage sampling circuit 022 is configured to respectively sample the voltage vmod1 of the first configuration pin MOD1 and the voltage vmod2 of the second configuration pin MOD2 when the voltage supply circuit 021 supplies the second reference voltage Vcc to the first configuration pin MOD1; and respectively sample the voltage vmod1 of the first configuration pin MOD1 and the voltage vmod2 of the second configuration pin MOD2 when the voltage supply circuit 021 supplies the second reference voltage Vcc to the second configuration pin MOD2.

In a specific implementation, the voltage supply circuit 021 may first supply the second reference voltage Vcc to the first configuration pin MOD1, and then supply the second reference voltage Vcc to the second configuration pin MOD2. Alternatively, the second reference voltage Vcc is first supplied to the second configuration pin MOD2, and then the second reference voltage Vcc is supplied to the first configuration pin MOD1. This is not limited herein.

For example, as shown in FIG. 6, the voltage supply circuit 021 may include a first data selector D1 and a switch K1. When a mode state of the chip needs to be configured, the switch K1 is turned on, the first data selector D1 chooses to supply the second reference voltage Vcc to the first configuration pin MOD1 or the second configuration pin MOD2. After the mode state of the chip is configured, the switch K1 is turned off, the configured resistor load 01 does not work, and there is no power loss.

For example, as shown in FIG. 6, the voltage sampling circuit 022 may include a second data selector D2. The second data selector D2 may supply the voltage vmod1 of the first configuration pin MOD1 or the voltage vmod2 of the second configuration pin MOD2 to the voltage ratio calculation unit 031.

Figure 7:
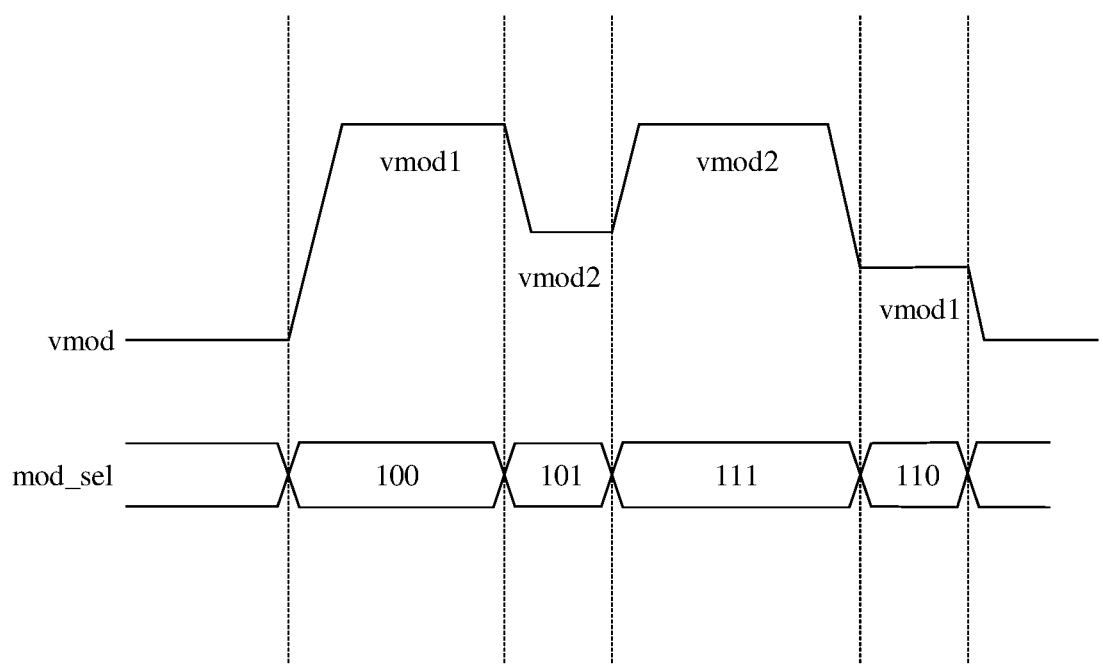
FIG. 7 is a sequence diagram of voltages output by a voltage sampling circuit according to an embodiment of this application.

The following describes a working process of the voltage sampling unit 02 by using an example in which the voltage supply circuit 021 first supplies the second reference voltage Vcc to the first configuration pin MOD1 and then supplies the second reference voltage Vcc to the second configuration pin MOD2. A sequence diagram of voltages vmod output by the voltage sampling circuit 022 in the voltage sampling unit 02 is shown in FIG. 7.

Figure 8A:
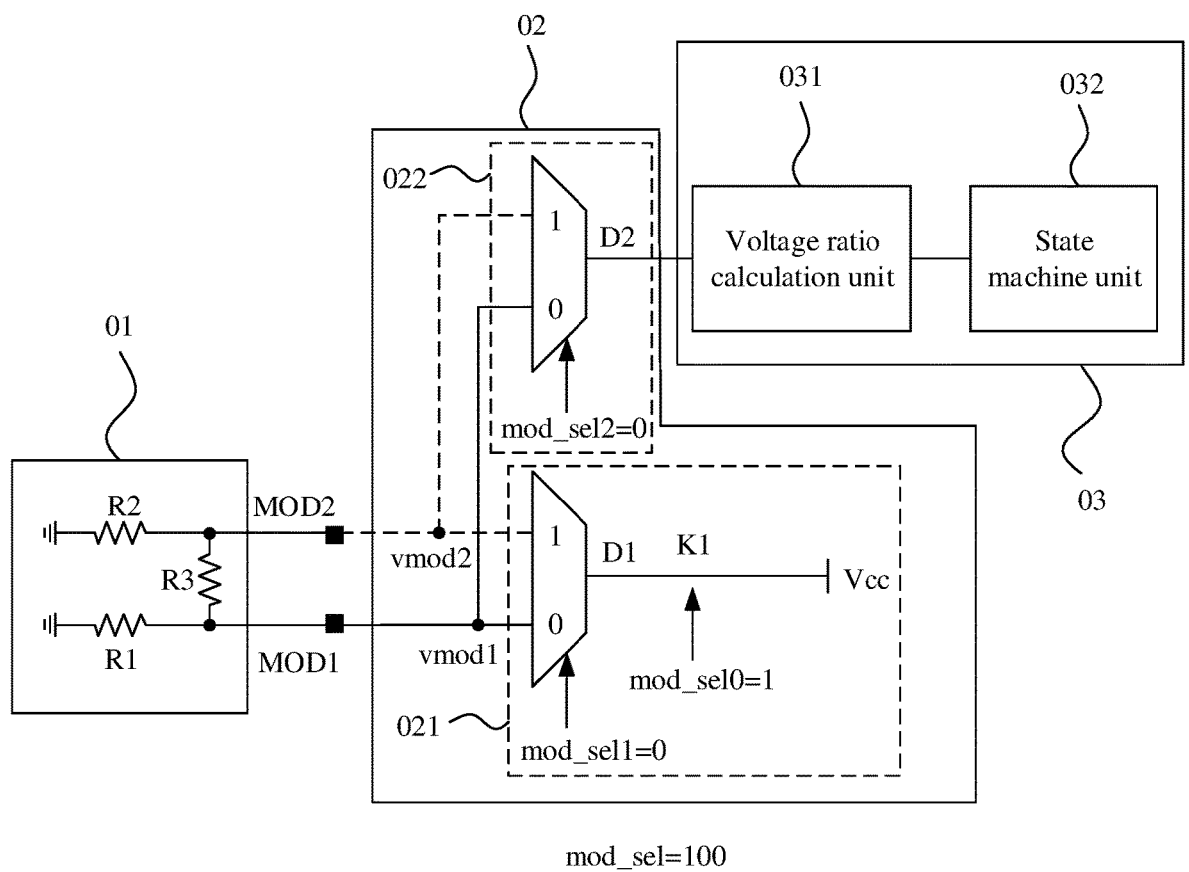
FIG. 8a to FIG. 8d are schematic working diagrams of a voltage sampling unit according to an embodiment of this application.

In the first stage, mod_sel=100. Referring to FIG. 8a, mod_sel0=1, mod_sel1=0, and mod_sel2=0. The switch K1 is turned on, the first data selector D1 supplies the second reference voltage Vcc to the first configuration pin MOD1, and the second data selector D2 supplies the voltage vmod1 of the first configuration pin MOD1 to the voltage ratio calculation unit 031. As shown in FIG. 7, in this case, the voltage sampling circuit 022 outputs a voltage vmod=vmod1=Vcc.

Figure 8B:
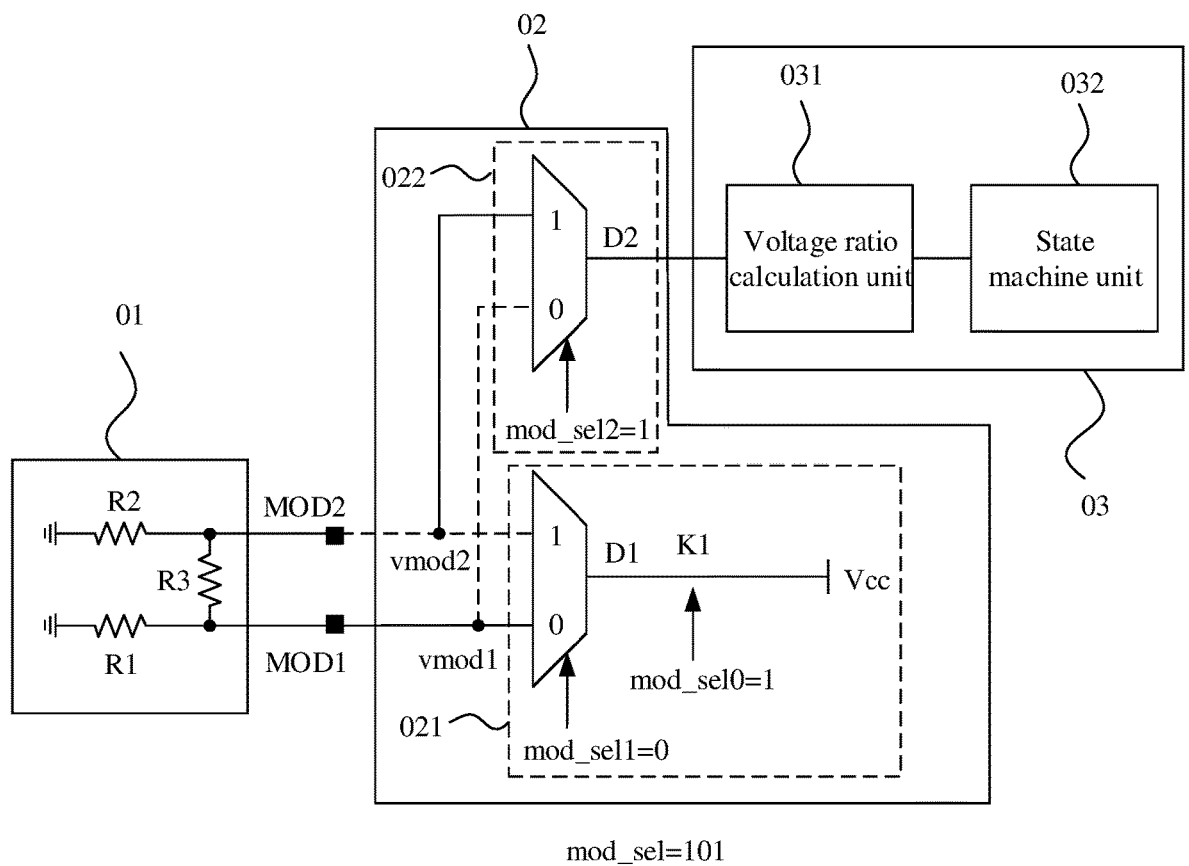

In the second stage, mod_sel=101. Referring to FIG. 8b, mod_sel0=1, mod_sel1=0, and mod_sel2=1. The switch K1 is turned on, the first data selector D1 supplies the second reference voltage Vcc to the first configuration pin MOD1, and the second data selector D2 supplies the voltage vmod2 of the second configuration pin MOD2 to the voltage ratio calculation unit 031. As shown in FIG. 7, in this case, the voltage sampling circuit 022 outputs a voltage vmod=vmod2=[R2/(R2, R3)]Vcc.

Figure 8C:
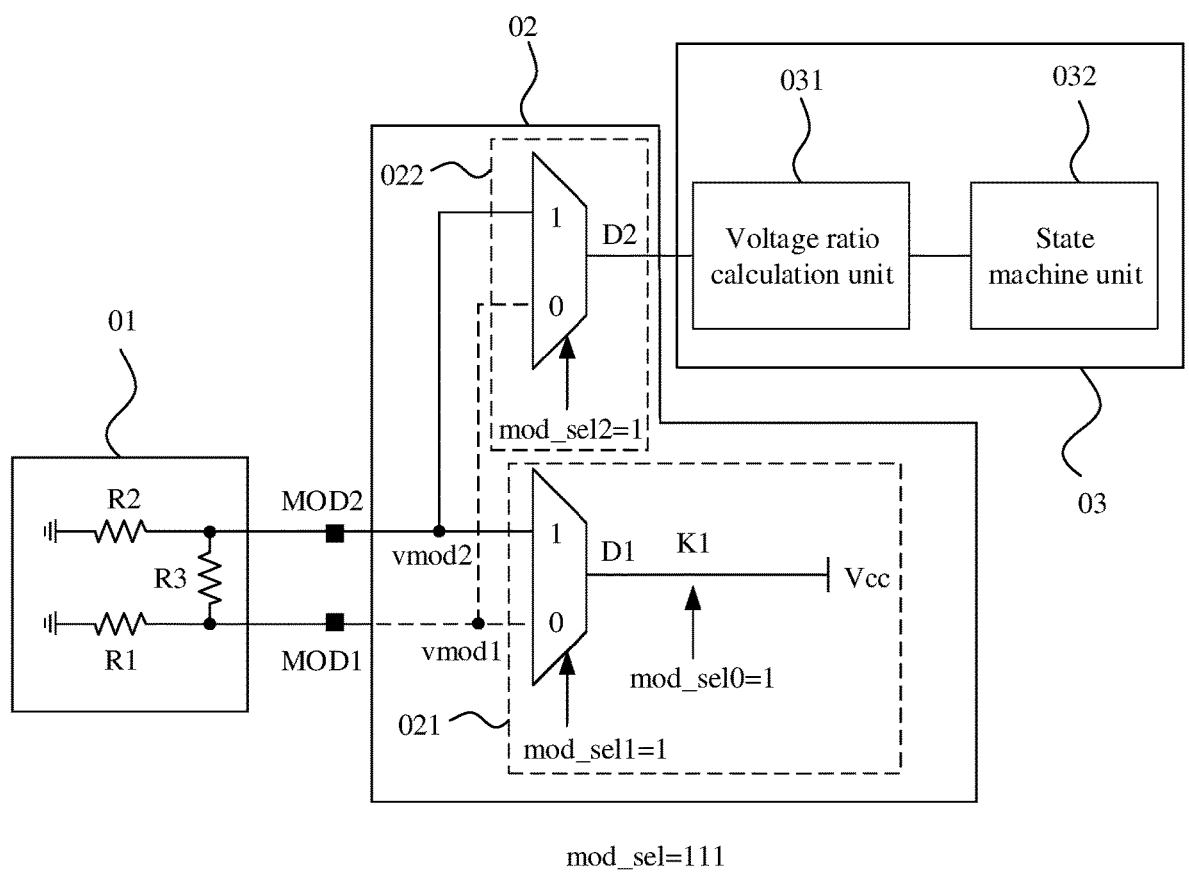

In the third stage, mod_sel=111. Referring to FIG. 8c, mod_sel0=1, mod_sel1=1, and mod_sel2=1. The switch K1 is turned on, the first data selector D1 supplies the second reference voltage Vcc to the second configuration pin MOD2, and the second data selector D2 supplies the voltage vmod2 of the second configuration pin MOD2 to the voltage ratio calculation unit 031. As shown in FIG. 7, in this case, the voltage sampling circuit 022 outputs a voltage vmod=vmod2=Vcc.

Figure 8D:
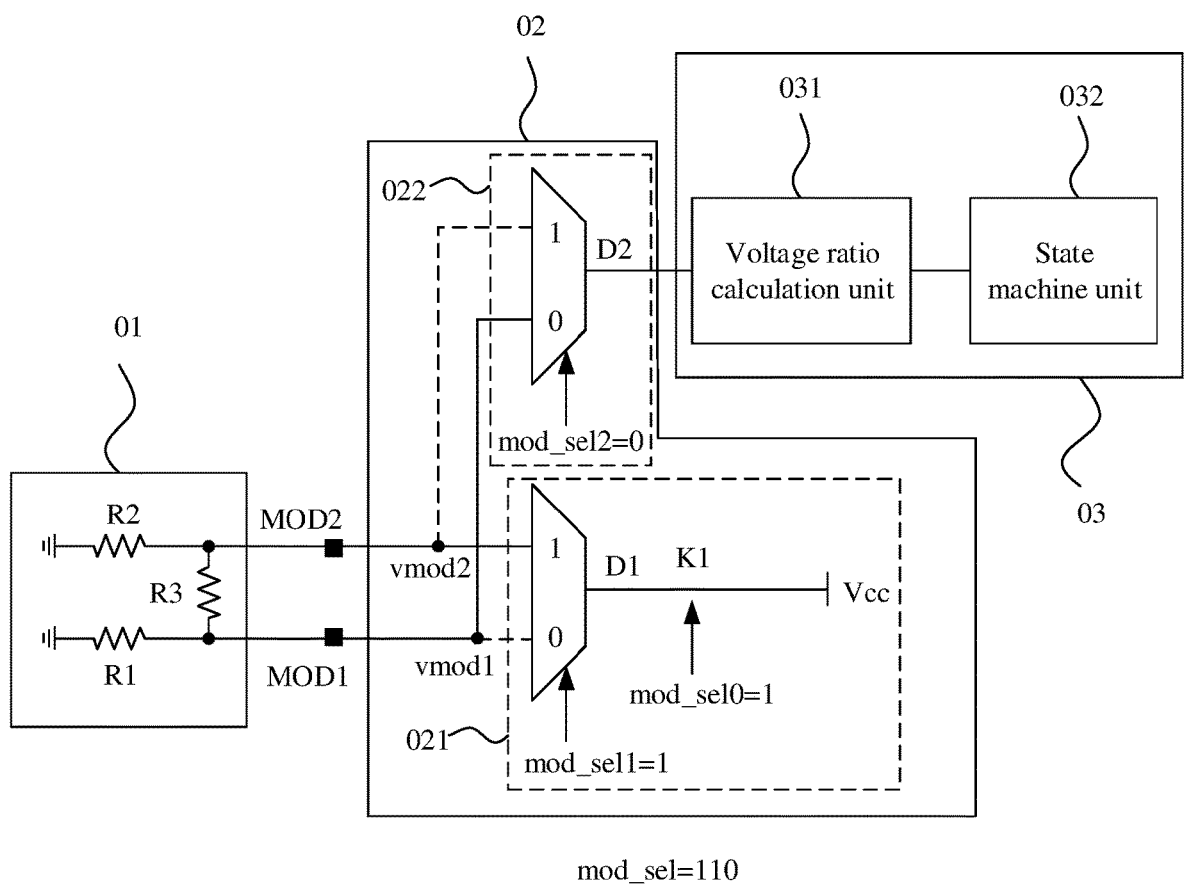

In the fourth stage, mod_sel=110. Referring to FIG. 8d, mod_sel0=1, mod_sel1=1, and mod_sel2=0. The switch K1 is turned on, the first data selector D1 supplies the second reference voltage Vcc to the second configuration pin MOD2, and the second data selector D2 supplies the voltage vmod1 of the first configuration pin MOD1 to the voltage ratio calculation unit 031. As shown in FIG. 7, in this case, the voltage sampling circuit 022 outputs a voltage vmod=vmod1=[R1/(R1, R3)]Vcc.

In FIG. 8a to FIG. 8d, a solid line represents voltage transmission, and a dashed line represents no voltage transmission.

The voltage ratio calculation unit 031 calculates the first voltage ratio mod_ratio1=vmod2/vmod1=R2/(R2+R3) based on the voltage vmod1 of the first configuration pin MOD1 in the first stage and the voltage vmod2 of the second configuration pin MOD2 in the second stage, and calculates the second voltage ratio mod_ratio2=vmod1/vmod2=R1/(R1+R3) based on the voltage vmod2 of the second configuration pin MOD2 in the third phase and the voltage vmod1 of the first configuration pin MOD1 in the fourth phase. Then, the state machine unit 032 may determine the corresponding pin configuration state based on the first voltage ratio and the second voltage ratio.

In a feasible implementation, the first voltage ratio mod_ratio1 may be compared with a first preset ratio ref_ratio1_$i$, to determine a state corresponding to the current first voltage ratio mod_ratio1, where ref_ratio1_$i$ represents a first preset ratio given in an $i^{th}$ state. The second voltage ratio mod_ratio2 may be compared with a second preset ratio ref_ratio2_$j$, to determine a state corresponding to the current second voltage ratio mod_ratio2, where ref_ratio2_$j$ represents a second preset ratio given in a $j^{th}$ state. Therefore, the corresponding pin configuration state is determined based on the two determined states. If i=1 to N and j=1 to N, N*N pin configuration states may be determined by configuring N different first voltage ratios and N different second voltage ratios, so that N*N mode states may be configured for the chip.

Figure 9:
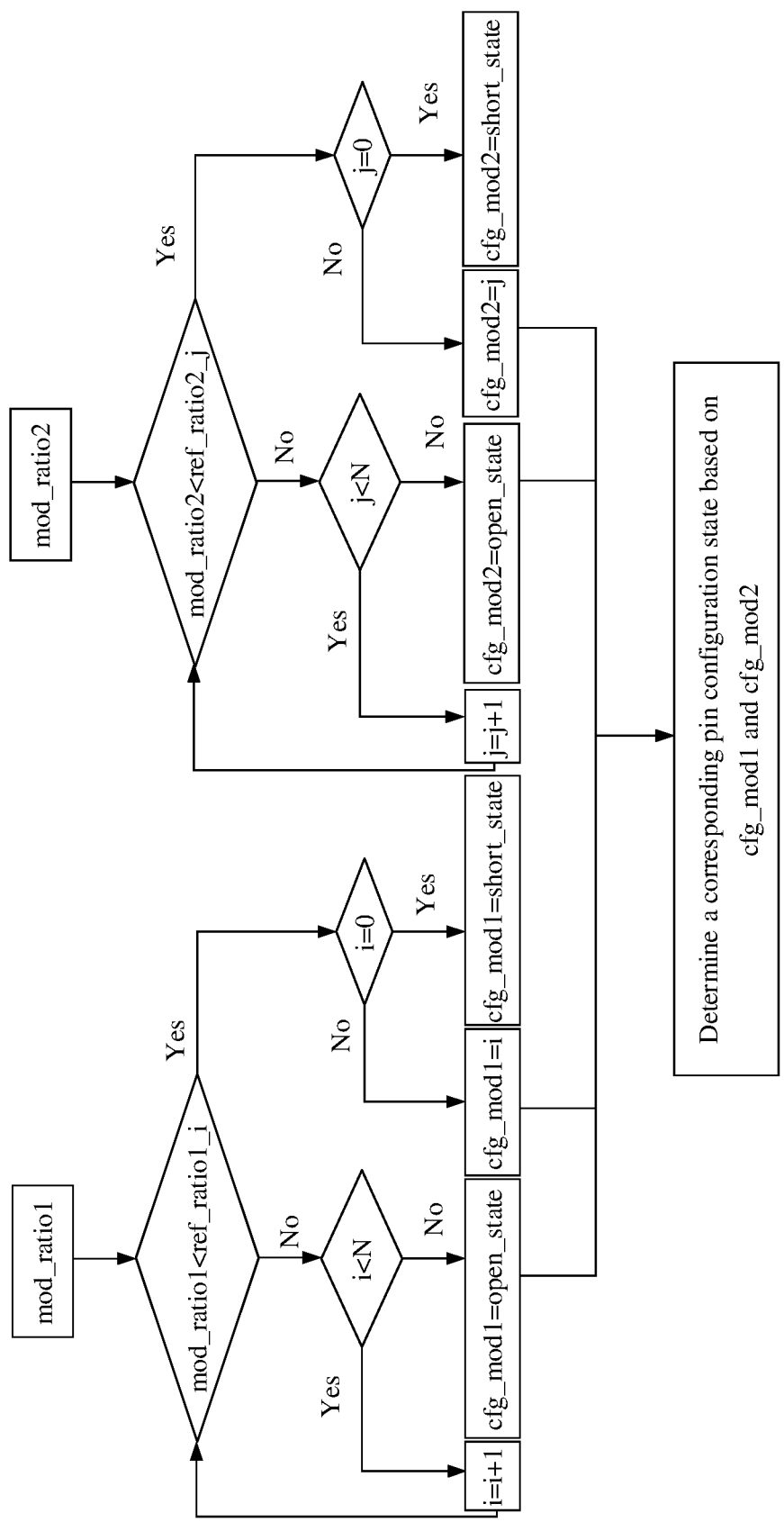
FIG. 9 is a schematic flowchart of determining a corresponding pin configuration state based on a first voltage ratio and a second voltage ratio according to this application.

In a specific implementation, as shown in FIG. 9, for example, an initial value of i is equal to 0, and ref_ratio1_1 to ref_ratio1_N are in ascending order. When a corresponding state cfg_mod1 is determined based on the first voltage ratio mod_ratio1, it may be first determined whether mod_ratio1 is less than ref_ratio1_$i$. If mod_ratio1 is less than ref_ratio1_$i$, it is determined whether i is equal to 0. If i is equal to 0, it is determined that the corresponding state is a short-circuit state in this case, that is, cfg_mod1=short_state. If i is not equal to 0, it is determined that the corresponding state is cfg_mod1=i. If mod_ratio1 is not less than ref_ratio1_i, it is determined whether i is less than N. If i is greater than or equal to N, it is determined that the corresponding state is an open-circuit state, that is, cfg_mod1=open_state. If i is less than N, after i=i+1, it is further determined whether mod_ratio1 is less than ref_ratio1_i, until the state cfg_mod1 corresponding to the first voltage ratio mod_ratio1 is determined. For example, an initial value of j is equal to 0, and ref_ratio2_1 to ref_ratio2_N are in ascending order. When a corresponding state cfg_mod2 is determined based on the second voltage ratio mod_ratio2, it may be first determined whether mod_ratio2 is less than ref_ratio2_j. If mod_ratio2 is less than ref_ratio2_j, it is determined whether j is equal to 0. If j is equal to 0, it is determined that the corresponding state is a short-circuit state in this case, that is, cfg_mod2=short_state. If j is not equal to 0, it is determined that the corresponding state is cfg_mod2=j. If mod_ratio2 is not less than ref_ratio2_j, it is determined whether j is less than N. If j is greater than or equal to N, it is determined that the corresponding state is an open-circuit state, that is, cfg_mod2=open_state. If j is less than N, after j=j+1, it is redetermined whether mod_ratio2 is less than ref_ratio1_j, until the state cfg_mod2 corresponding to the second voltage ratio mod_ratio2 is determined. Finally, the corresponding pin configuration state is determined based on the two determined states cfg_mod1 and cfg_mod2.

In conclusion, in Embodiment 1, N*N states are configured by using the two configuration pins and the π-type resistor topology structure of the configured resistor load. Compared with the related technology, first, a precision of a state value is improved based on a resistor voltage division ratio. Second, more states can be configured by using two configuration pins. Finally, when the configuration circuit does not work, the configured resistor load does not work. Therefore, there is no power loss.

Embodiment 2

Figure 10:
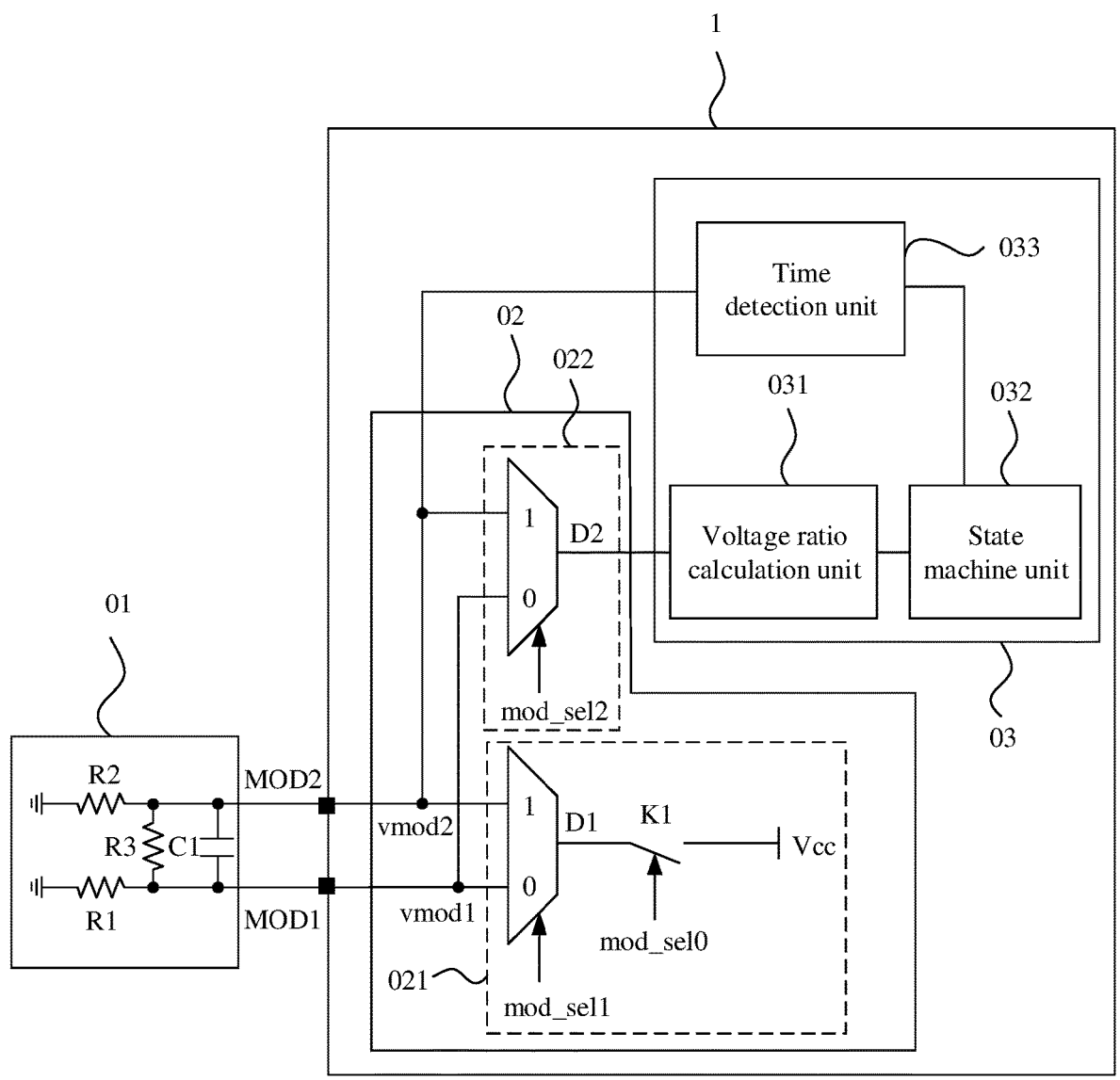
FIG. 10 is a schematic diagram of a structure of still another pin state configuration circuit according to an embodiment of this application.

For example, referring to FIG. 10, the configured resistor load 01 may further include a first capacitor C1 connected in parallel to the third resistor R3. The comparator 03 may further include a time detection unit 033. The time detection unit 033 is configured to detect a charging time or a discharging time of the first capacitor C1 when the voltage sampling unit 02 supplies the second reference voltage Vcc to the configured resistor load 01. The state machine unit 032 is configured to determine a corresponding pin configuration state based on the first voltage ratio, the second voltage ratio, and the charging time or the discharging time of the first capacitor C1 that is detected by the time detection unit 033.

Figure 11:
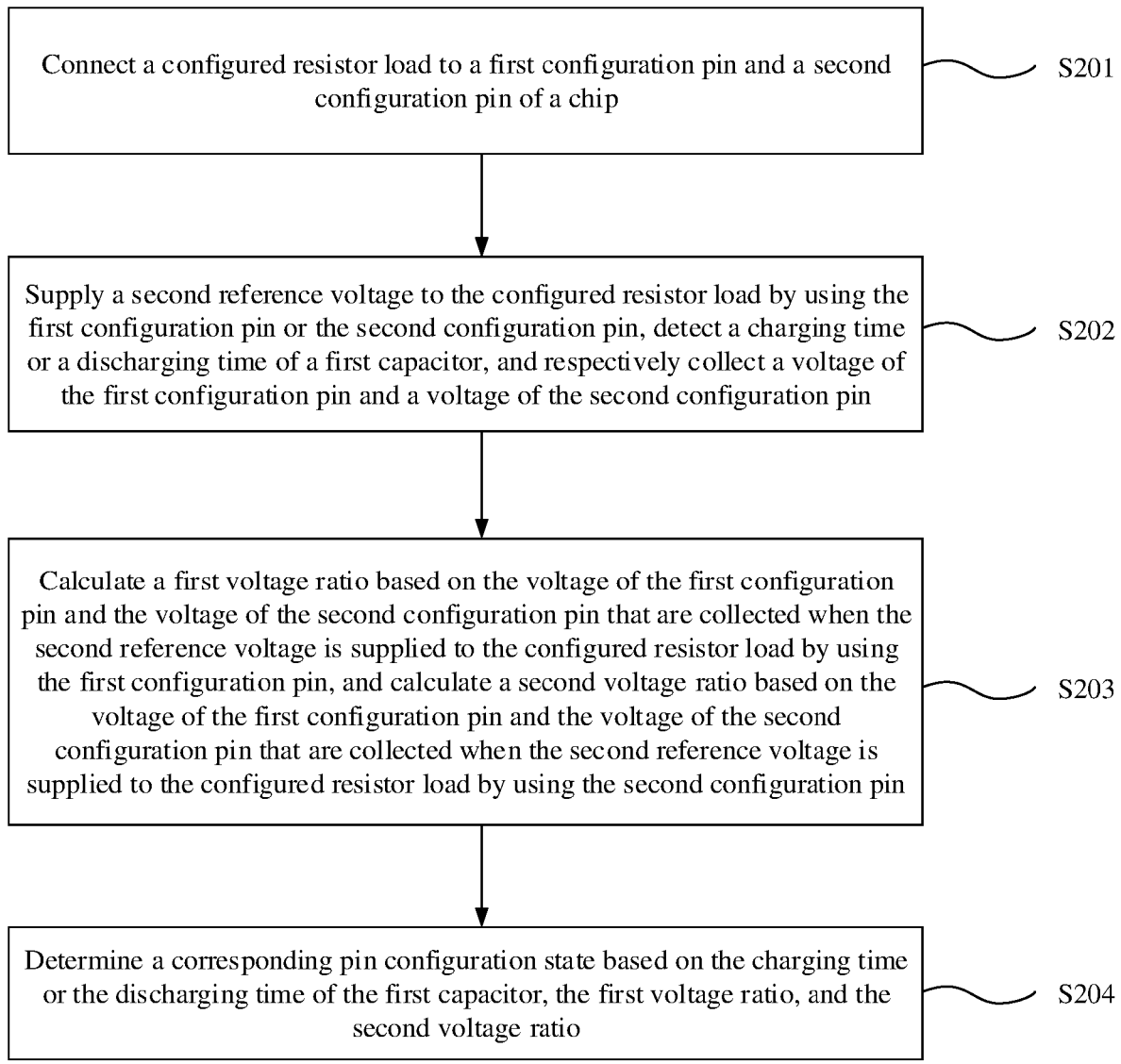
FIG. 11 is a schematic flowchart of a pin state configuration method according to Embodiment 2 of this application.

A configuration method corresponding to the configuration circuit shown in FIG. 10 is shown in FIG. 11, and may include the following steps.

S201. Connect the configured resistor load to the first configuration pin and the second configuration pin of the chip.

S202. Supply a second reference voltage to the configured resistor load by using the first configuration pin or the second configuration pin, detect a charging time or a discharging time of the first capacitor, and respectively sample a voltage of the first configuration pin and a voltage of the second configuration pin.

Figure 12:
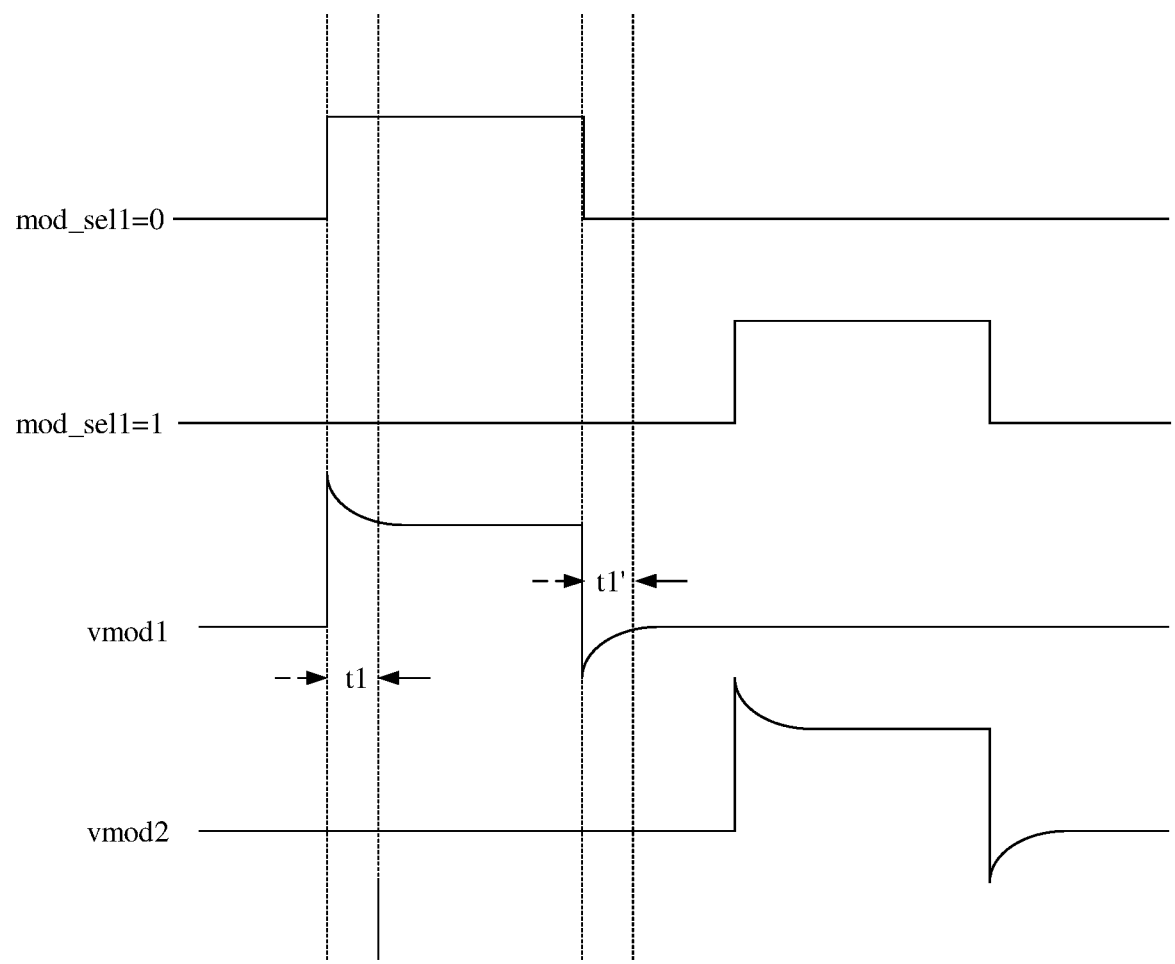
FIG. 12 is a schematic diagram of detecting, by a time detection unit, a charging time or a discharging time of a first capacitor according to Embodiment 2 of this application.

Referring to FIG. 12, the charging time t1 or the discharging time t1' of the first capacitor C1 may be detected by detecting the voltage vmod1 of the first configuration pin MOD1 when the second reference voltage Vcc is supplied to the first configuration pin MOD1, or detecting the voltage vmod2 of the second configuration pin MOD2 when the second reference voltage Vcc is supplied to the second configuration pin MOD2.

In a specific implementation, the time detection unit 033 may be connected to the first configuration pin MOD1, or may be connected to the second configuration pin MOD2. FIG. 10 shows an example in which the time detection unit 033 is connected to the second configuration pin MOD2. When the time detection unit 033 is connected to the first configuration pin MOD1, a time constant of the first capacitor C1 is $\tau=[R2R3/(R2+R3)]*C1$. When the time detection unit 033 is connected to the second configuration pin MOD2, a time constant of the first capacitor C1 is $\tau=[R1R3/(R1+R3)]*C1$. M states may be obtained by configuring a capacitance value of the first capacitor C1.

S203. Calculate a first voltage ratio based on the voltage of the first configuration pin and the voltage of the second configuration pin that are sampled when the second reference voltage is supplied to the configured resistor load by using the first configuration pin, and calculate a second voltage ratio based on the voltage of the first configuration pin and the voltage of the second configuration pin that are sampled when the second reference voltage is supplied to the configured resistor load by using the second configuration pin.

S204. Determine a corresponding pin configuration state based on the charging time or the discharging time of the first capacitor, the first voltage ratio, and the second voltage ratio.

For a specific implementation of Embodiment 2, refer to Embodiment 1. Compared with Embodiment 1, Embodiment 2 has the first capacitor and the time detection unit added. A corresponding pin configuration state may be determined by combining the charging time or the discharging time of the first capacitor, the first voltage ratio, and the second voltage ratio, and N×N×M states may be configured. Values of N and M may be the same, or may be different. This is not limited herein.

Embodiment 3

Figure 13:
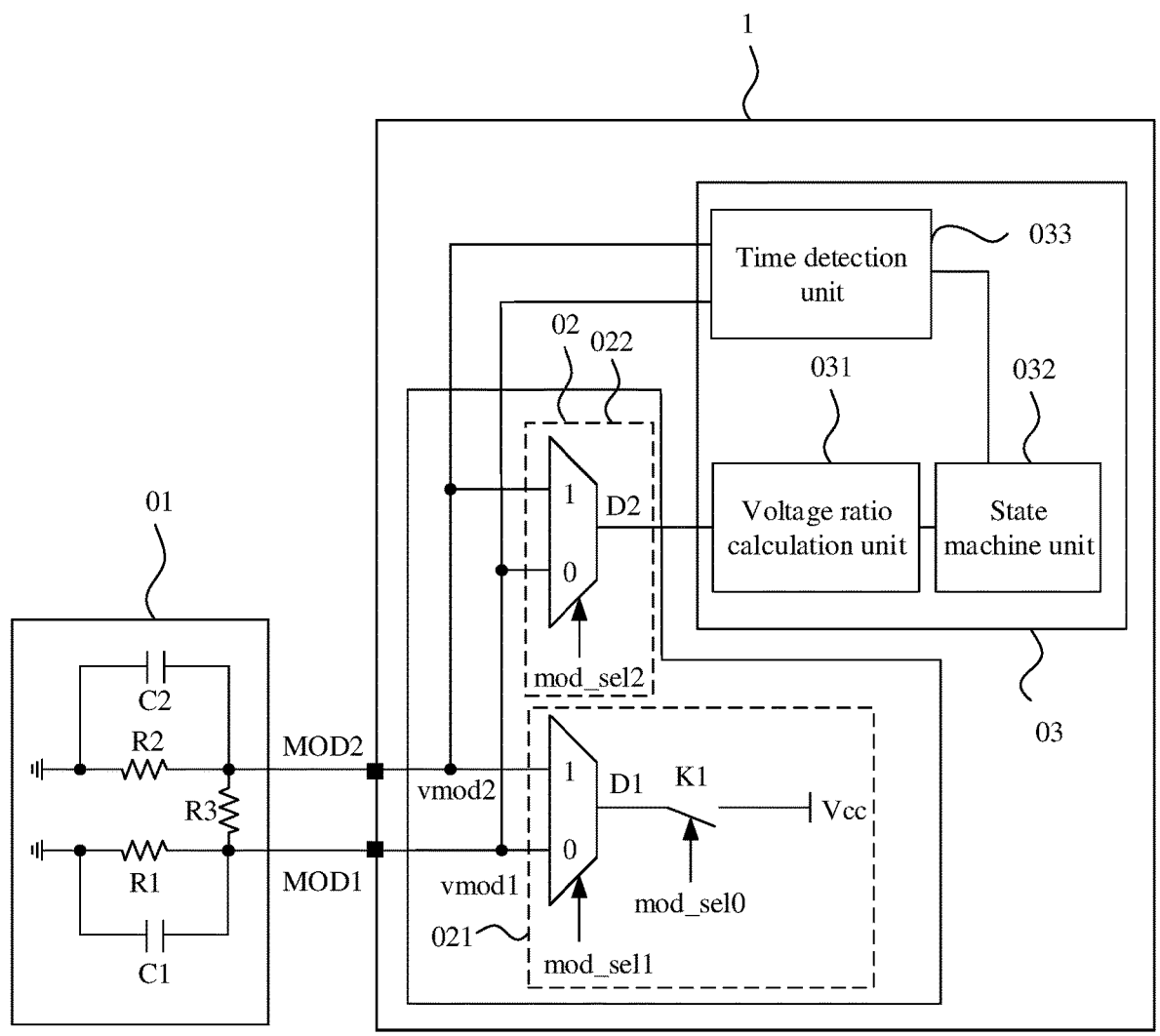
FIG. 13 is a schematic diagram of a structure of still another pin state configuration circuit according to an embodiment of this application.

For example, referring to FIG. 13, the configured resistor load 01 may further include a first capacitor C1 connected in parallel to the first resistor R1, and a second capacitor C2 connected in parallel to the second resistor R2. The comparator 03 may further include a time detection unit 033. The time detection unit 033 is configured to respectively detect a charging time or a discharging time of the first capacitor C1 and a charging time or a discharging time of the second capacitor C2 when the voltage sampling unit 02 supplies the second reference voltage Vcc to the configured resistor load 01. The state machine unit 032 is configured to determine a corresponding pin configuration state based on the first voltage ratio, the second voltage ratio, and the charging time or the discharging time of the first capacitor C1 and the charging time or the discharging time of the second capacitor C2 that are detected by the time detection unit 033.

Figure 14:
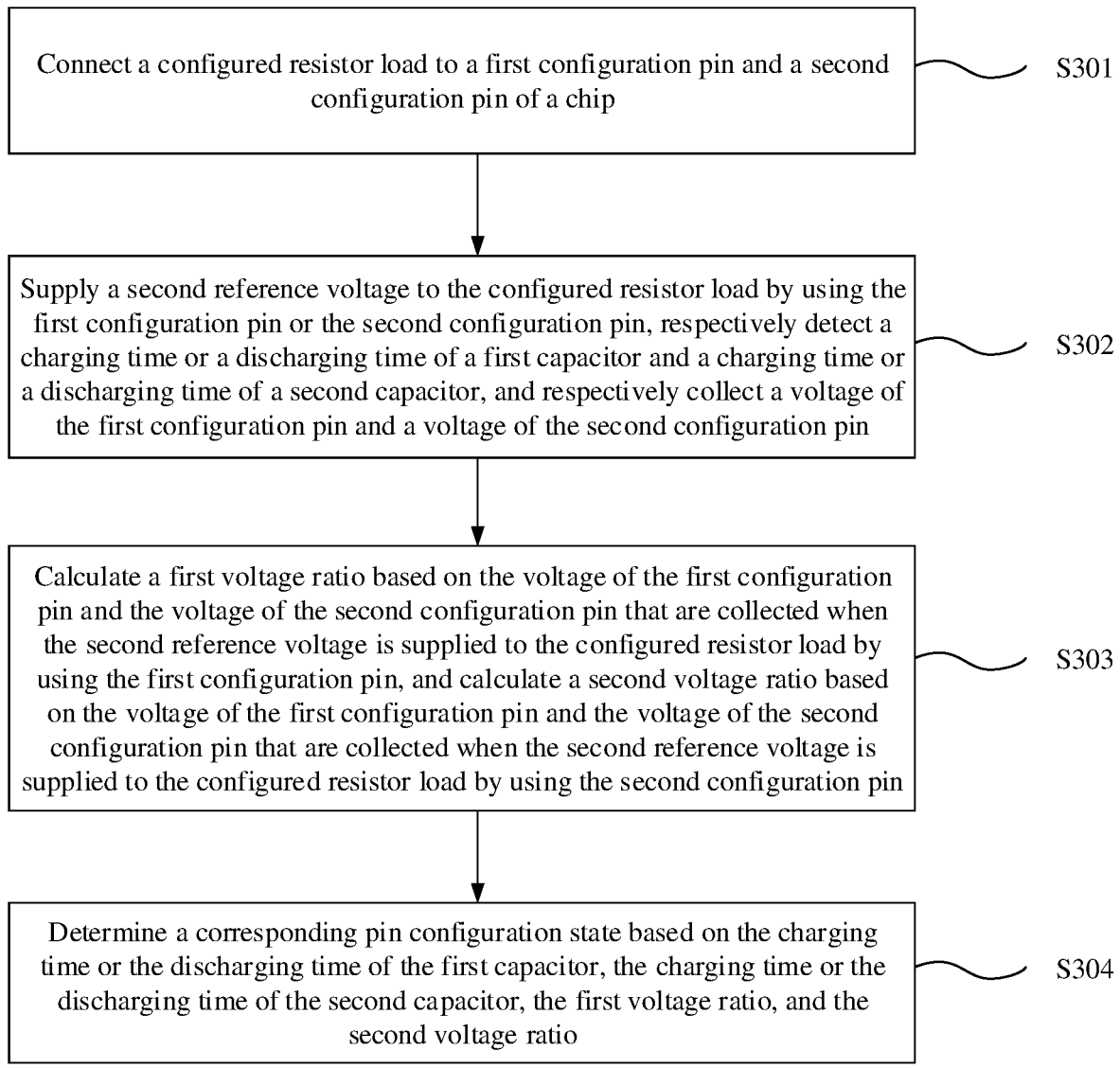
FIG. 14 is a schematic flowchart of a pin state configuration method according to Embodiment 3 of this application.

A configuration method corresponding to the configuration circuit shown in FIG. 13 is shown in FIG. 14, and may include the following steps.

S301. Connect the configured resistor load to the first configuration pin and the second configuration pin of the chip.

S302. Supply a second reference voltage to the configured resistor load by using the first configuration pin or the second configuration pin, respectively detect a charging time or a discharging time of the first capacitor and a charging time or a discharging time of the second capacitor, and respectively sample a voltage of the first configuration pin and a voltage of the second configuration pin.

Figure 15:
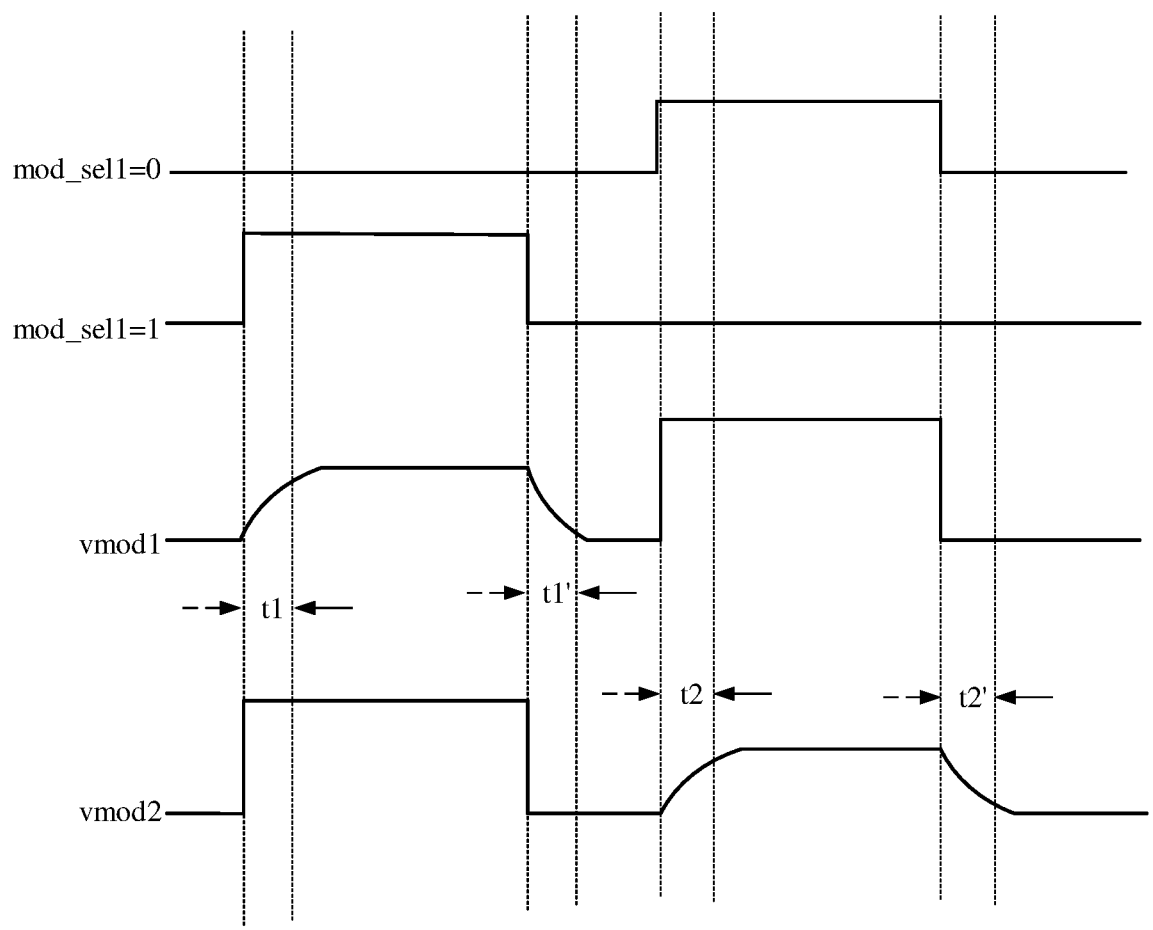
FIG. 15 is a schematic diagram of detecting, by a time detection unit, a charging time or a discharging time of a first capacitor and a charging time or a discharging time of a second capacitor according to Embodiment 3 of this application.

Referring to FIG. 15, the charging time t2 or the discharging time t2' of the second capacitor C2 may be detected by detecting the voltage vmod2 of the second configuration pin MOD2 when the second reference voltage Vcc is supplied to the first configuration pin MOD1; and the charging time t1 or the discharging time t1' of the first capacitor C1 may be detected by detecting the voltage vmod1 of the first configuration pin MOD1 when the second reference voltage Vcc is supplied to the second configuration pin MOD2.

In a specific implementation, the time detection unit 033 is respectively connected to the first configuration pin MOD1 and the second configuration pin MOD2. When the second reference voltage Vcc is supplied to the first configuration pin MOD1, the second resistor R2, the third resistor R3, and the second capacitor C2 form an RC series-parallel circuit, and a time constant of the second capacitor C2 is $\tau=[R2R3/(R2+R3)]*C2$. When the second reference voltage Vcc is supplied to the second configuration pin MOD2, the first resistor R1, the third resistor R3, and the first capacitor C1 form an RC series-parallel circuit, and a time constant of the first capacitor C1 is $\tau=[R1R3/(R1+R3)]*C1$. M states may be obtained by configuring a capacitance value of the first capacitor C1, and M states may be obtained by configuring a capacitance value of the second capacitor C2.

S303. Calculate a first voltage ratio based on the voltage of the first configuration pin and the voltage of the second configuration pin that are sampled when the second reference voltage is supplied to the configured resistor load by using the first configuration pin, and calculate a second voltage ratio based on the voltage of the first configuration pin and the voltage of the second configuration pin that are sampled when the second reference voltage is supplied to the configured resistor load by using the second configuration pin.

S304. Determine a corresponding pin configuration state based on the charging time or the discharging time of the first capacitor, the charging time or the discharging time of the second capacitor, the first voltage ratio, and the second voltage ratio.

For a specific implementation of Embodiment 3, refer to Embodiment 1. Compared with Embodiment 1, Embodiment 3 has the first capacitor, the second capacitor, and the time detection unit added. A corresponding pin configuration state may be determined by combining the charging time or the discharging time of the first capacitor, the charging time or the discharging time of the second capacitor, the first voltage ratio, and the second voltage ratio, and N×N×M×M states may be configured. Values of N and M may be the same, or may be different. This is not limited herein.

Embodiment 4

Figure 16:
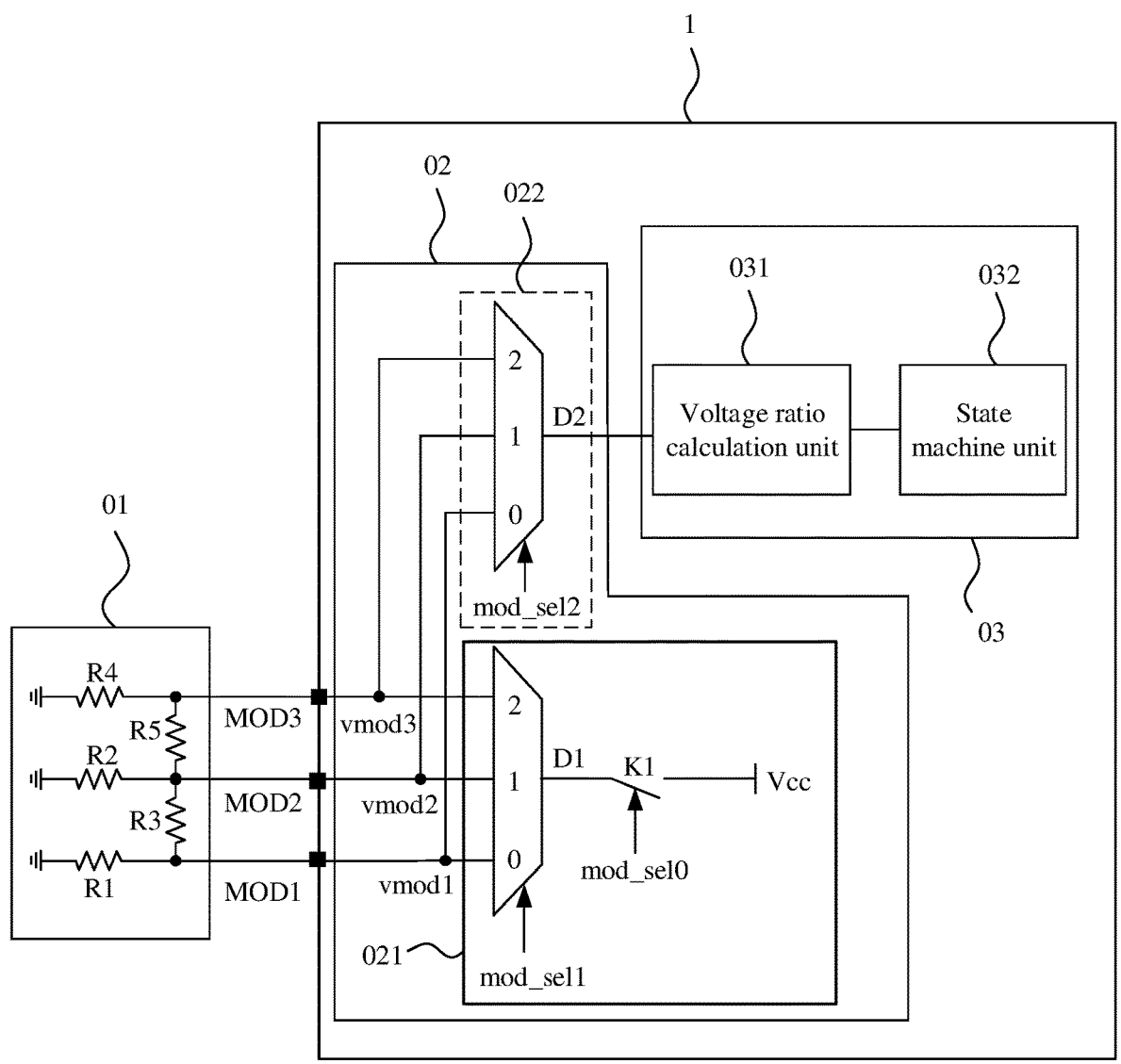
FIG. 16 is a schematic diagram of a structure of still another pin state configuration circuit according to an embodiment of this application.

For example, referring to FIG. 16, the configured resistor load 01 is further configured to connect to a third configuration pin MOD3 of the chip. The configured resistor load 01 may further include a configurable fourth resistor R4 and a configurable fifth resistor R5. A first terminal of the fourth resistor R4 is configured to connect to the first reference voltage, for example, grounded, and a second terminal of the fourth resistor R4 is configured to connect to the third configuration pin MOD3. The fifth resistor R5 is connected between the second terminal of the fourth resistor R4 and the second terminal of the second resistor R2. The voltage sampling unit 02 is further configured to sample a voltage vmod3 of the third configuration pin MOD3 when the second reference voltage Vcc is supplied to the configured resistor load 01 by using the second configuration pin MOD2. The voltage ratio calculation unit 031 is further configured to calculate a third voltage ratio based on the voltage vmod2 of the second configuration pin MOD2 and the voltage vmod3 of the third configuration pin MOD3 that are sampled by the voltage sampling unit 02 when the second reference voltage Vcc is supplied to the configured resistor load 01 by using the second configuration pin MOD2. The state machine unit 032 is configured to determine a corresponding pin configuration state based on the first voltage ratio, the second voltage ratio, and the third voltage ratio.

Figure 17:
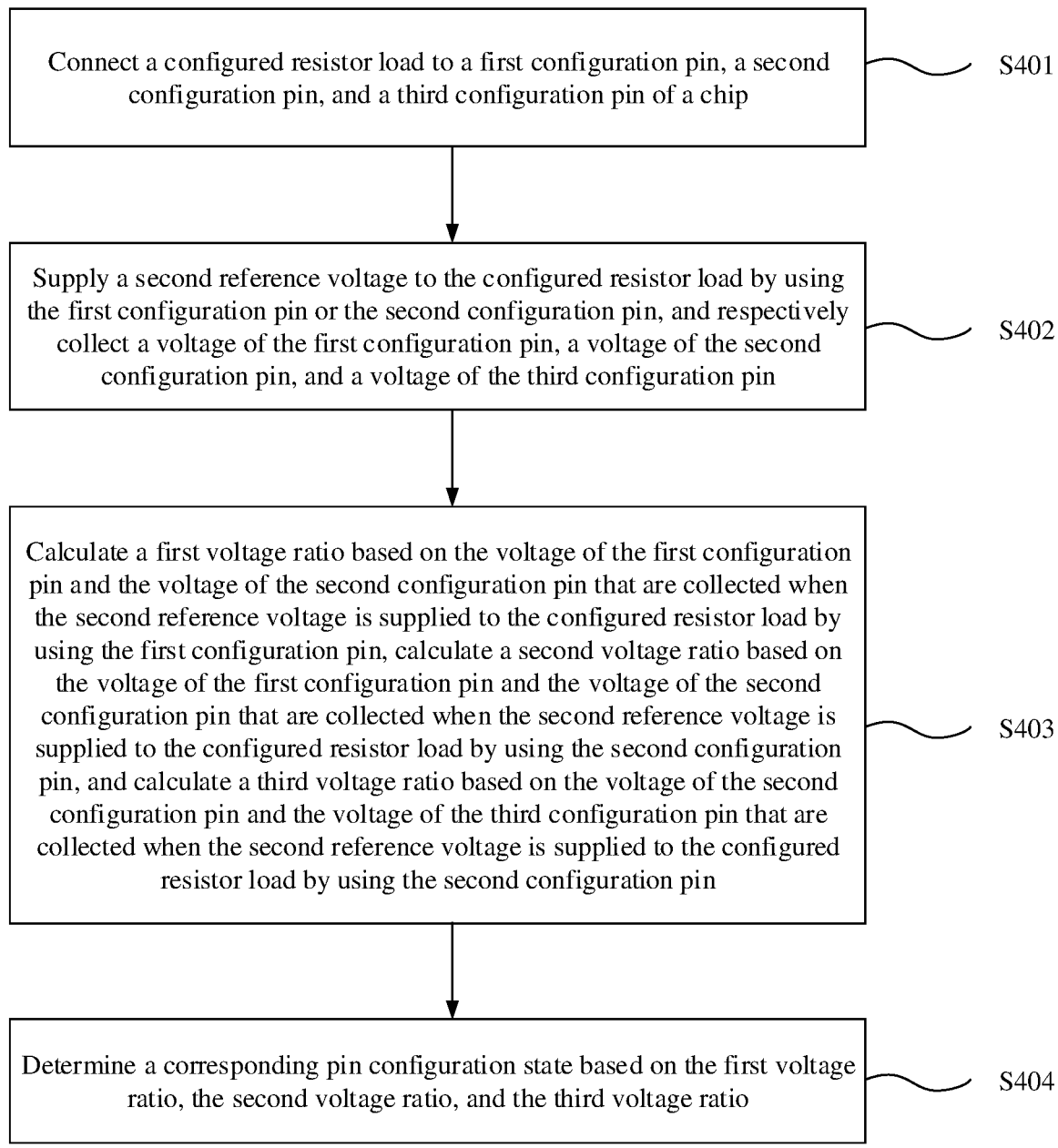
FIG. 17 is a schematic flowchart of a pin state configuration method according to Embodiment 4 of this application.

A configuration method corresponding to the configuration circuit shown in FIG. 16 is shown in FIG. 17, and may include the following steps.

S401. Connect the configured resistor load to the first configuration pin, the second configuration pin, and the third configuration pin of the chip.

S402. Supply a second reference voltage to the configured resistor load by using the first configuration pin or the second configuration pin, and respectively sample a voltage of the first configuration pin, a voltage of the second configuration pin, and a voltage of the third configuration pin.

In a specific implementation, when the second reference voltage is supplied to the configured resistor load by using the first configuration pin, the voltage of the first configuration pin and the voltage of the second configuration pin are respectively sampled. In this case, the voltage of the first configuration pin is vmod1=Vcc, and the voltage of the second configuration pin is vmod2=[Rx/(Rx+R3)]Vcc, where 1/Rx=1/R2+1/(R4+R5). When the second reference voltage is supplied to the configured resistor load by using the second configuration pin, the voltage of the first configuration pin, the voltage of the second configuration pin, and the voltage of the third configuration pin are respectively sampled. In this case, the voltage of the second configuration pin is vmod2=Vcc, the voltage of the first configuration pin is vmod1=[R1/(R1+R3)]Vcc, and the voltage of the third configuration pin is vmod3=[R4/(R4+R5)] Vcc.

S403. Calculate a first voltage ratio based on the voltage of the first configuration pin and the voltage of the second configuration pin that are sampled when the second reference voltage is supplied to the configured resistor load by using the first configuration pin, calculate a second voltage ratio based on the voltage of the first configuration pin and the voltage of the second configuration pin that are sampled when the second reference voltage is supplied to the configured resistor load by using the second configuration pin, and calculate a third voltage ratio based on the voltage of the second configuration pin and the voltage of the third configuration pin that are sampled when the second reference voltage is supplied to the configured resistor load by using the second configuration pin.

The first voltage ratio may be equal to a ratio of the voltage of the second configuration pin to the voltage of the first configuration pin, which are sampled when the second reference voltage is supplied to the configured resistor load by using the first configuration pin. That is, the first voltage ratio is mod_ratio1=vmod2/vmod1=Rx/(Rx+R3). The second voltage ratio may be equal to a ratio of the voltage of the first configuration pin to the voltage of the second configuration pin, which are sampled when the second reference voltage is supplied to the configured resistor load by using the second configuration pin. That is, the second voltage ratio is mod_ratio2=vmod1/vmod2=R1/(R1+R3). The third voltage ratio may be equal to a ratio of the voltage of the third configuration pin to the voltage of the second configuration pin, which are sampled when the second reference voltage is supplied to the configured resistor load by using the second configuration pin. That is, the third voltage ratio is mod_ratio3=vmod3/vmod2=R4/(R4+R5).

Certainly, in a specific implementation, the first voltage ratio may alternatively be calculated based on the voltage of the second configuration pin and the voltage of the third configuration pin that are respectively sampled when the second reference voltage is supplied to the configured resistor load by using the third configuration pin. For example, when the second reference voltage is supplied to the configured resistor load by using the third configuration pin, in this case, the voltage of the third configuration pin is vmod3=Vcc, and the voltage of the second configuration pin is vmod2=[Ry/(Ry+R5)]Vcc, where 1/Ry=1/R2+1/(R1+R3). The first voltage ratio may be equal to a ratio of the voltage of the second configuration pin to the voltage of the third configuration pin. That is, the first voltage ratio is mod_ratio1=vmod2/vmod3=Ry/(Ry+R5).

S404. Determine a corresponding pin configuration state based on the first voltage ratio, the second voltage ratio, and the third voltage ratio.

For a specific implementation of Embodiment 4, refer to Embodiment 1. Compared with Embodiment 1, Embodiment 4 has the fourth resistor and the fifth resistor added to the configured resistor load, and has one more configuration pin. A corresponding pin configuration state may be determined by combining the first voltage ratio, the second voltage ratio, and the third voltage ratio, and N×N×N states may be configured.

Embodiment 5

Figure 18:
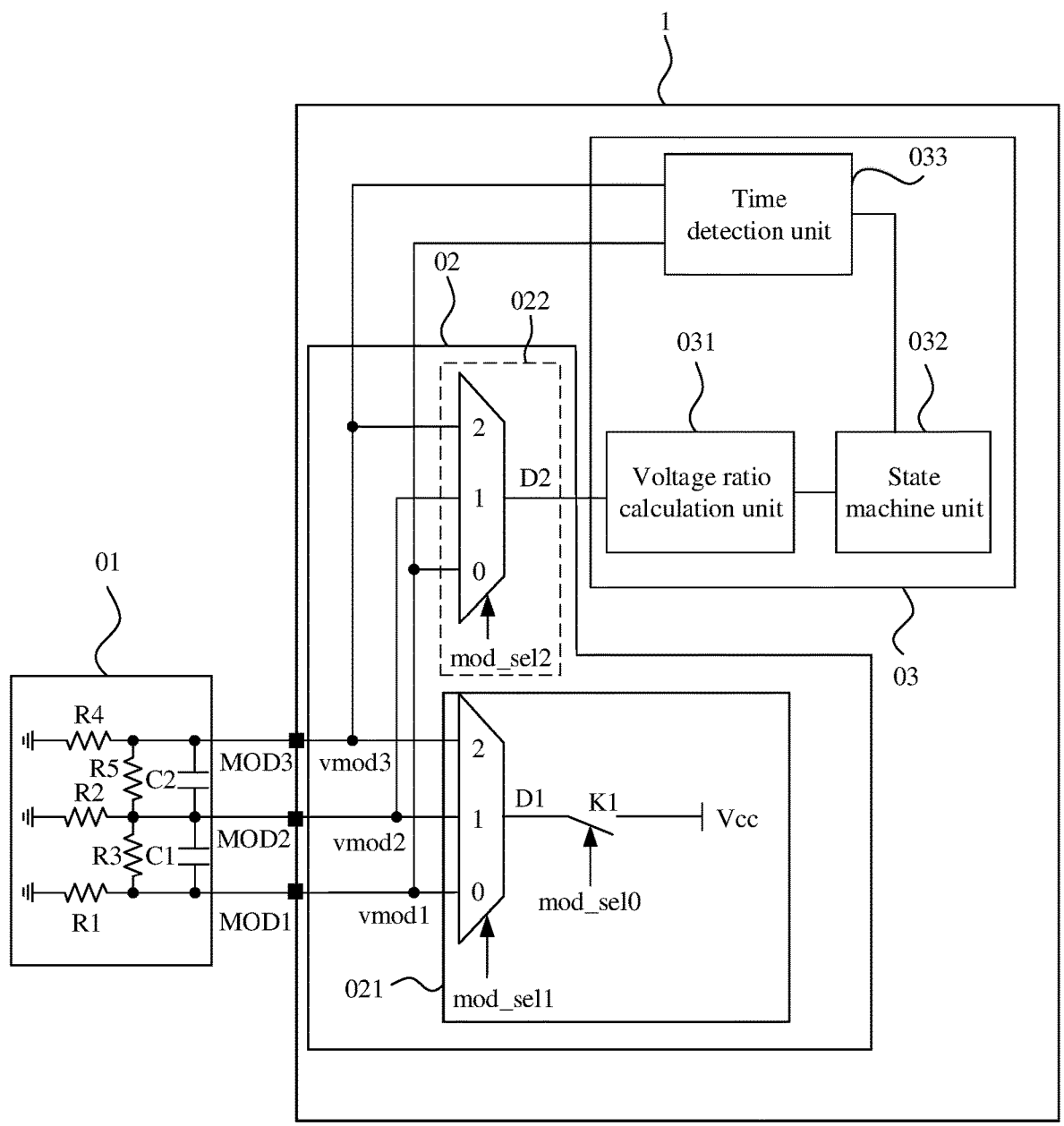
FIG. 18 is a schematic diagram of a structure of still another pin state configuration circuit according to an embodiment of this application.

For example, referring to FIG. 18, the configured resistor load 01 may further include a first capacitor C1 connected in parallel to the third resistor R3, and a second capacitor C2 connected in parallel to the fifth resistor R5. The comparator 03 may further include a time detection unit 033. The time detection unit 033 is configured to respectively detect a charging time or a discharging time of the first capacitor C1 and a charging time or a discharging time of the second capacitor C2 when the voltage sampling unit 02 supplies the second reference voltage Vcc to the configured resistor load 01. The state machine unit 032 is configured to determine a corresponding pin configuration state based on the first voltage ratio, the second voltage ratio, and the charging time or the discharging time of the first capacitor C1 and the charging time or the discharging time of the second capacitor C2 that are detected by the time detection unit 033.

Figure 19:
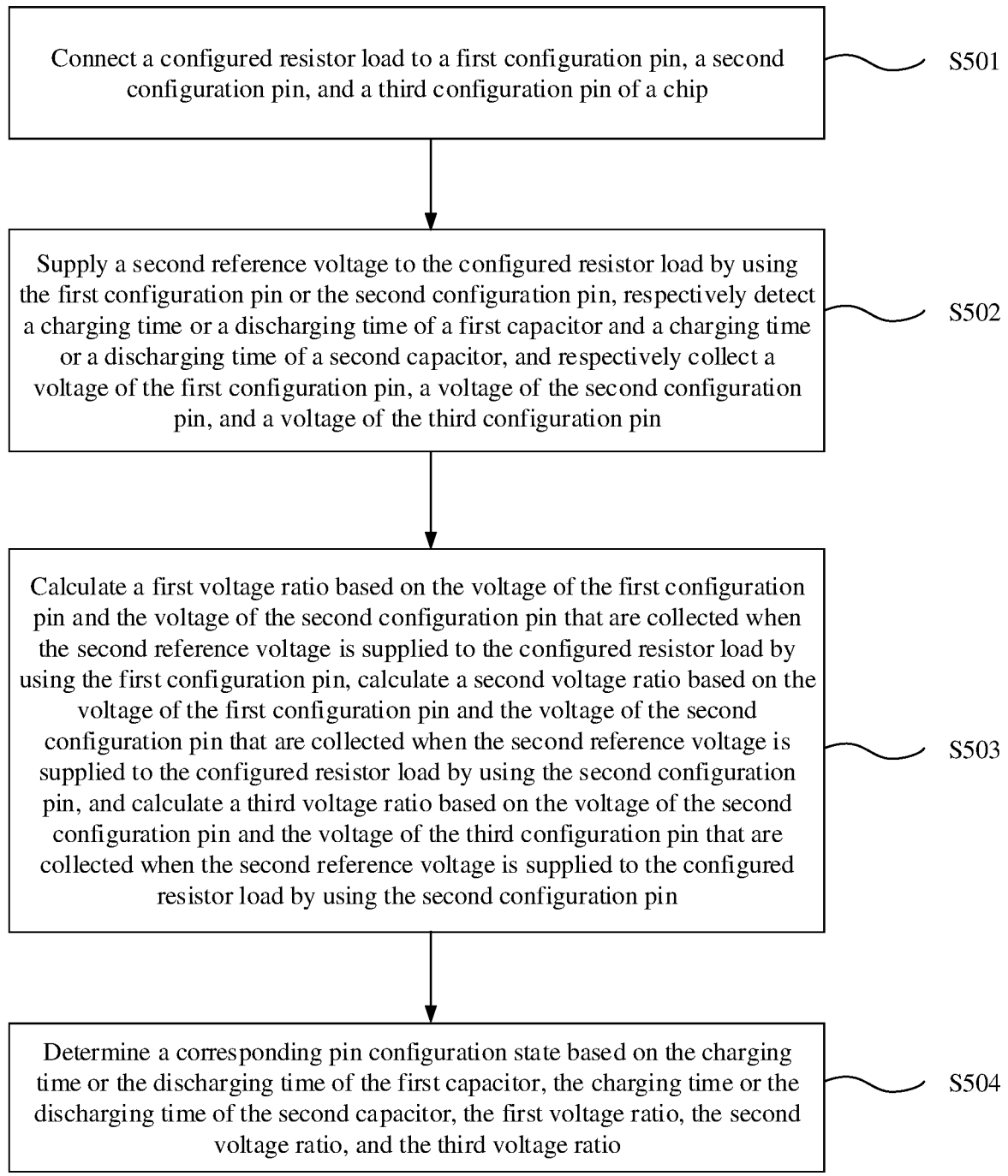
FIG. 19 is a schematic flowchart of a pin state configuration method according to Embodiment 5 of this application.

A configuration method corresponding to the configuration circuit shown in FIG. 18 is shown in FIG. 19, and may include the following steps.

S501. Connect the configured resistor load to the first configuration pin, the second configuration pin, and the third configuration pin of the chip.

S502. Supply a second reference voltage to the configured resistor load by using the first configuration pin or the second configuration pin, respectively detect a charging time or a discharging time of the first capacitor and a charging time or a discharging time of the second capacitor, and respectively sample a voltage of the first configuration pin, a voltage of the second configuration pin, and a voltage of the third configuration pin.

In a specific implementation, when the second reference voltage is supplied to the configured resistor load by using the first configuration pin, the voltage of the first configuration pin and the voltage of the second configuration pin are respectively sampled. When the second reference voltage is supplied to the configured resistor load by using the second configuration pin, the voltage of the first configuration pin, the voltage of the second configuration pin, and the voltage of the third configuration pin are respectively sampled.

In a specific implementation, the time detection unit 033 is respectively connected to the first configuration pin MOD1 and the third configuration pin MOD3. M states may be obtained by configuring a capacitance value of the first capacitor C1, and M states may be obtained by configuring a capacitance value of the second capacitor C2.

S503. Calculate a first voltage ratio based on the voltage of the first configuration pin and the voltage of the second configuration pin that are sampled when the second reference voltage is supplied to the configured resistor load by using the first configuration pin, calculate a second voltage ratio based on the voltage of the first configuration pin and the voltage of the second configuration pin that are sampled when the second reference voltage is supplied to the configured resistor load by using the second configuration pin, and calculate a third voltage ratio based on the voltage of the second configuration pin and the voltage of the third configuration pin that are sampled when the second reference voltage is supplied to the configured resistor load by using the second configuration pin.

S504. Determine a corresponding pin configuration state based on the charging time or the discharging time of the first capacitor, the charging time or the discharging time of the second capacitor, the first voltage ratio, the second voltage ratio, and the third voltage ratio.

Compared with Embodiment 4, Embodiment 5 has the first capacitor, the second capacitor, and the time detection unit added. A corresponding pin configuration state may be determined by combining the charging time or the discharging time of the first capacitor, the charging time or the discharging time of the second capacitor, the first voltage ratio, the second voltage ratio, and the third voltage ratio, and N×N×N×M×M states may be configured. Values of N and M may be the same, or may be different. This is not limited herein.

Embodiment 6

Figure 21:
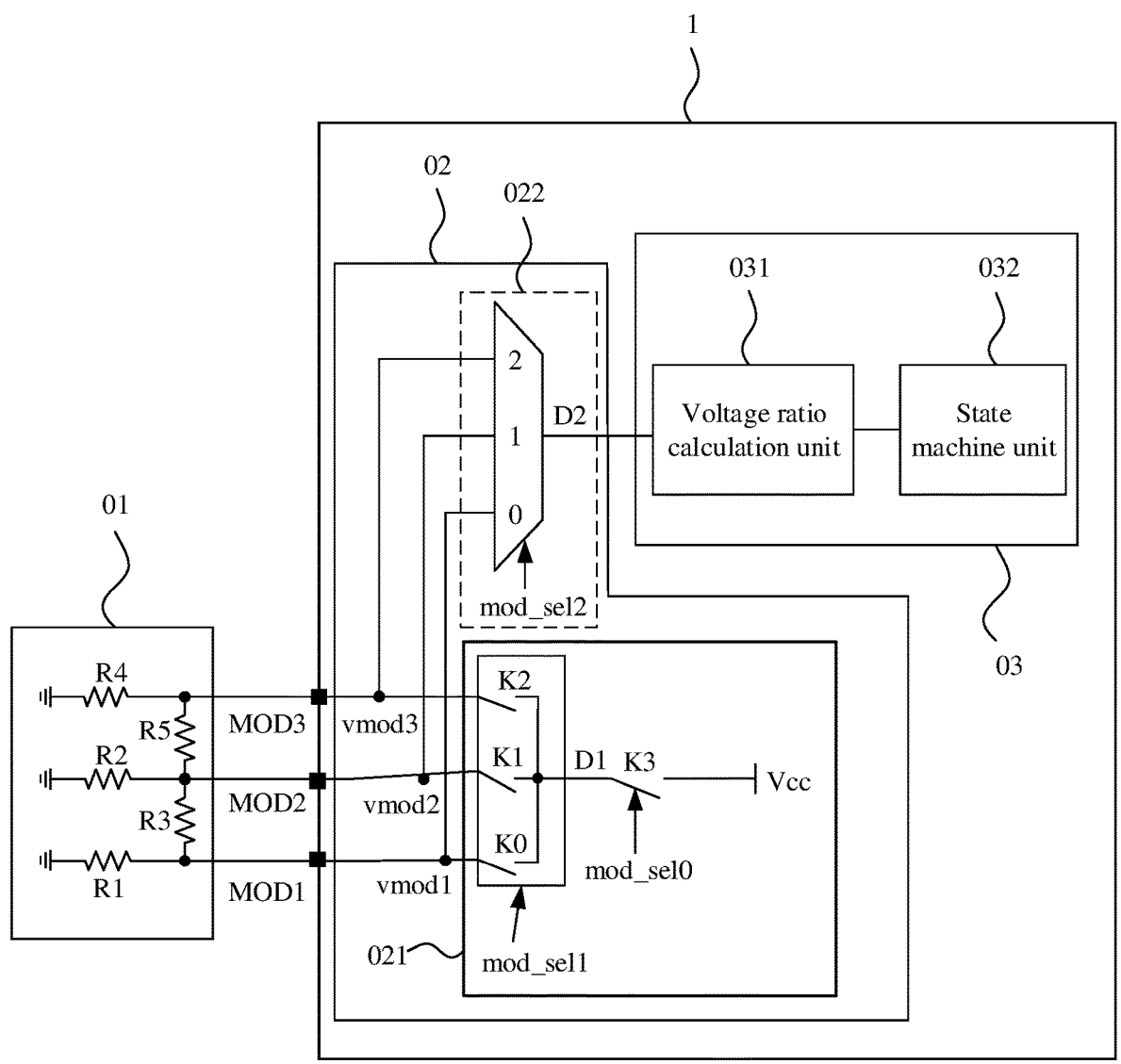
FIG. 21 is a schematic diagram of a structure of still another pin state configuration circuit according to an embodiment of this application.

FIG. 21 is a schematic diagram of a structure of still another pin state configuration circuit according to an embodiment of this application. As shown in FIG. 21, the configuration circuit may include a configured resistor load 01, a voltage sampling unit 02, and a comparator 03, and the comparator 03 may include a voltage ratio calculation unit 031 and a state machine unit 032. The voltage sampling unit 02 is configured to supply a second reference voltage Vcc to the configured resistor load 01 by using the second configuration pin MOD2, and respectively sample a voltage vmod1 of the first configuration pin MOD1, a voltage vmod2 of the second configuration pin MOD2, and a voltage vmod3 of the third configuration pin MOD3; and supply the second reference voltage Vcc to the configured resistor load 01 by using the first configuration pin MOD1 and the third configuration pin MOD3 simultaneously, and respectively sample the voltage vmod1 of the first configuration pin MOD1, the voltage vmod2 of the second configuration pin MOD2, and the voltage vmod3 of the third configuration pin MOD3. The voltage ratio calculation unit 031 is configured to calculate a first voltage ratio and a third voltage ratio based on the voltage vmod1 of the first configuration pin MOD1, the voltage vmod2 of the second configuration pin MOD2, and the voltage vmod3 of the third configuration pin MOD3 that are sampled by the voltage sampling unit 02 when the second reference voltage Vcc is supplied to the configured resistor load 01 by using the second configuration pin MOD2; and calculate a second voltage ratio based on the voltage vmod1 of the first configuration pin MOD1, the voltage vmod2 of the second configuration pin MOD2, and the voltage vmod3 of the third configuration pin MOD3 that are sampled by the voltage sampling unit 02 when the second reference voltage Vcc is supplied to the configured resistor load 01 by using the third configuration pin MOD3 and the first configuration pin MOD1 simultaneously. The state machine unit 032 is configured to determine a corresponding pin configuration state based on the first voltage ratio, the second voltage ratio, and the third voltage ratio.

Figure 20:
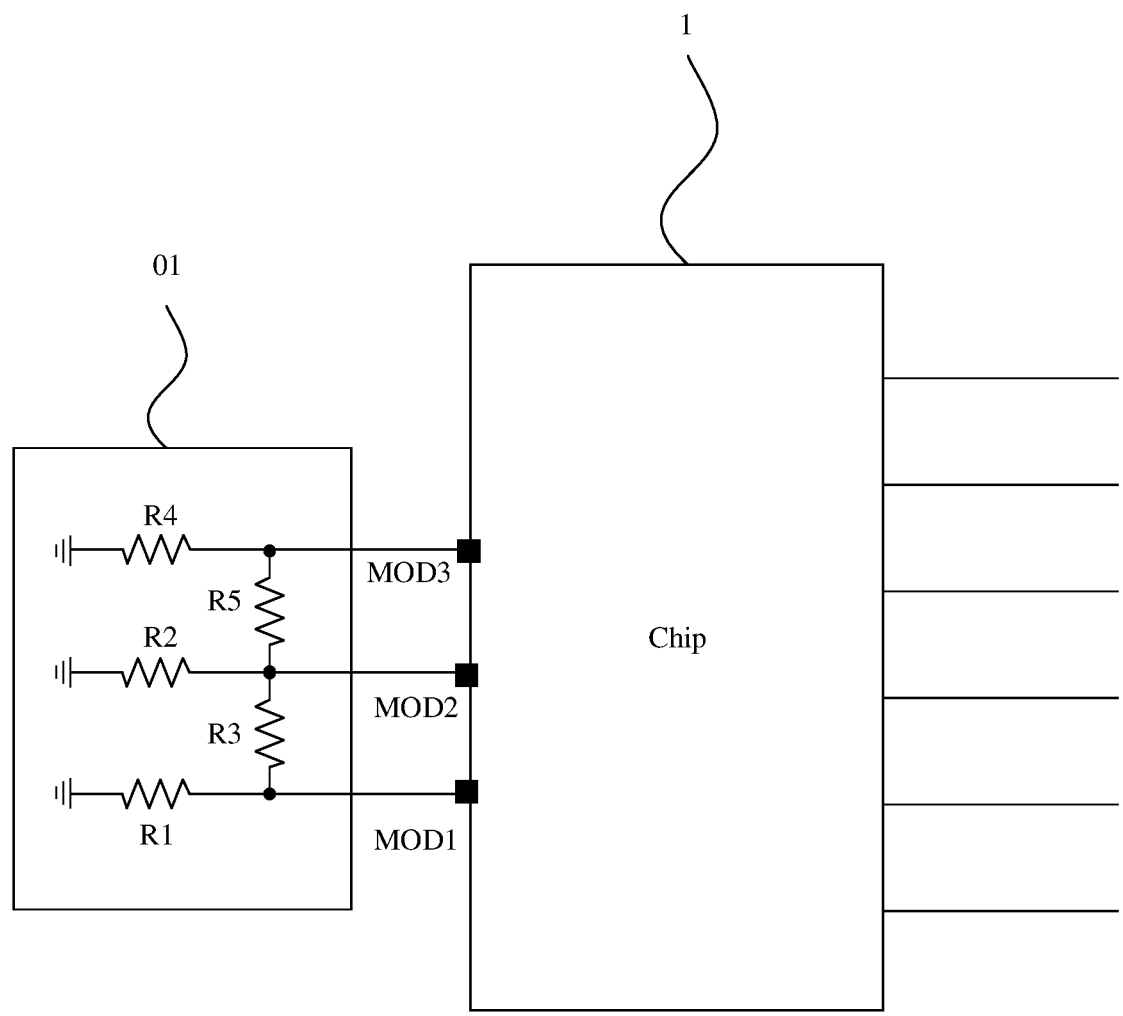
FIG. 20 is a schematic diagram of a structure of another configured resistor load according to an embodiment of this application.

For example, referring to FIG. 20, when the chip has three configuration pins, the configured resistor load 01 may include a configurable first resistor R1, a configurable second resistor R2, a configurable third resistor R3, a configurable fourth resistor R4, and a configurable fifth resistor R5. A first terminal of the first resistor R1 is connected to a first reference voltage, for example, grounded, and a second terminal of the first resistor R1 is connected to the first configuration pin MOD1; a first terminal of the second resistor R2 is connected to the first reference voltage, for example, grounded, and a second terminal of the second resistor R2 is connected to the second configuration pin MOD2; the third resistor R3 is connected between the second terminal of the first resistor R1 and the second terminal of the second resistor R2; a first terminal of the fourth resistor R4 is configured to connect to the first reference voltage, and a second terminal of the fourth resistor R4 is configured to connect to the third configuration pin MOD3; and the fifth resistor R5 is connected between the second terminal of the fourth resistor R4 and the second terminal of the second resistor R2.

For example, as shown in FIG. 21, the voltage sampling unit 02 may include a voltage supply circuit 021 and a voltage sampling circuit 022. The voltage supply circuit 021 may include a first data selector D1 and a switch K3. The first data selector D1 may include three switches K0 to K2. When a mode state of the chip needs to be configured, the switch K3 is turned on, the first data selector D1 chooses to supply the second reference voltage Vcc to the first configuration pin MOD1, the second configuration pin MOD2, or the third configuration pin MOD3. After the mode state of the chip is configured, the switch K3 is turned off, the configured resistor load 01 does not work, and there is no power loss. The voltage sampling circuit 022 may include a second data selector D2. The second data selector D2 may supply the voltage vmod1 of the first configuration pin MOD1, the voltage vmod2 of the second configuration pin MOD2, or the voltage vmod3 of the third configuration pin MOD3 to the voltage ratio calculation unit 031.

Figure 22:
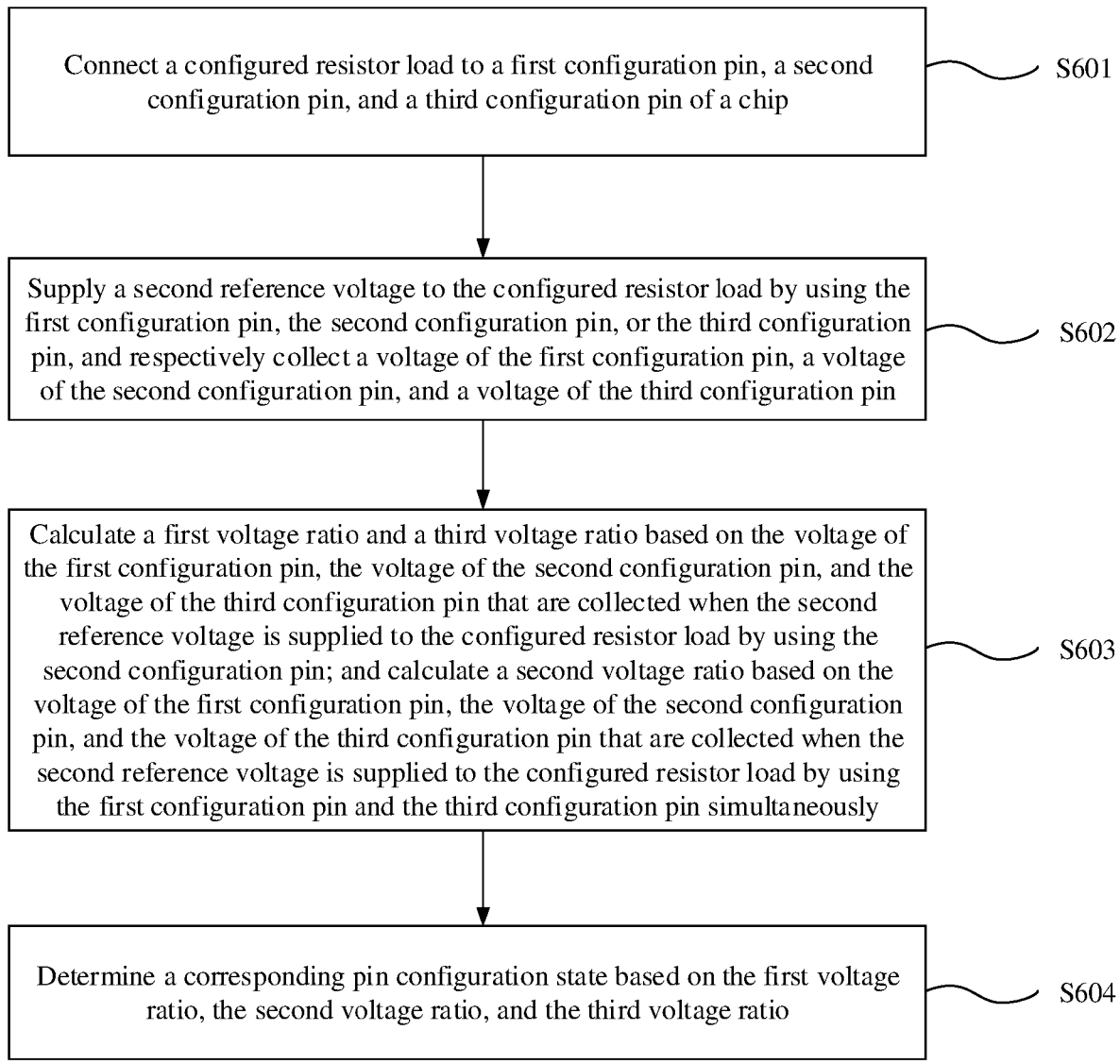
FIG. 22 is a schematic flowchart of a pin state configuration method according to Embodiment 6 of this application.

A configuration method corresponding to the configuration circuit shown in FIG. 21 is shown in FIG. 22, and may include the following steps.

S601. Connect the configured resistor load to the first configuration pin, the second configuration pin, and the third configuration pin of the chip.

S602. Supply a second reference voltage to the configured resistor load by using the first configuration pin, the second configuration pin, or the third configuration pin, and respectively sample a voltage of the first configuration pin, a voltage of the second configuration pin, and a voltage of the third configuration pin.

For example, the configured resistor load may use the structure shown in FIG. 20. In a specific implementation, for example, a resistance value of the third resistor is configured to be equal to a resistance value of the fifth resistor, that is, R3=R5, and when the second reference voltage is supplied to the configured resistor load by using the second configuration pin, the voltage of the first configuration pin, the voltage of the second configuration pin, and the voltage of the third configuration pin are respectively sampled. In this case, the voltage of the second configuration pin is vmod2=Vcc, the voltage of the first configuration pin is vmod1=[R1/(R1+R3)]Vcc, and the voltage of the third configuration pin is vmod3=[R4/(R4+R3)]Vcc. When the second reference voltage is supplied to the configured resistor load by using the first configuration pin and the third configuration pin simultaneously, the voltage of the first configuration pin, the voltage of the second configuration pin, and the voltage of the third configuration pin are respectively sampled. In this case, both the voltage vmod1 of the first configuration pin and the voltage Vmod3 of the third configuration pin are equal to Vcc, and the voltage of the second configuration pin is vmod2=[R2/(R2+R3/2)]Vcc.

S603. Calculate a first voltage ratio and a third voltage ratio based on the voltage of the first configuration pin, the voltage of the second configuration pin, and the voltage of the third configuration pin that are sampled when the second reference voltage is supplied to the configured resistor load by using the second configuration pin; and calculate a second voltage ratio based on the voltage of the first configuration pin, the voltage of the second configuration pin, and the voltage of the third configuration pin that are sampled when the second reference voltage is supplied to the configured resistor load by using the first configuration pin and the third configuration pin simultaneously.

For example, the first voltage ratio may be calculated based on the voltage of the first configuration pin and the voltage of the second configuration pin that are sampled when the second reference voltage is supplied to the configured resistor load by using the second configuration pin, and the third voltage ratio may be calculated based on the voltage of the third configuration pin and the voltage of the second configuration pin. For example, the first voltage ratio may be equal to a ratio of the voltage of the first configuration pin to the voltage of the second configuration pin, which are sampled when the second reference voltage is supplied to the configured resistor load by using the second configuration pin. That is, the first voltage ratio is mod_ratio1=vmod1/vmod2=R1/(R1+R3). The third voltage ratio may be equal to a ratio of the voltage of the third configuration pin to the voltage of the second configuration pin, which are sampled when the second reference voltage is supplied to the configured resistor load by using the second configuration pin. That is, the third voltage ratio is mod_ratio3=vmod3/vmod2=R4/(R4+R3).

For example, the second voltage ratio may be calculated based on the voltage of the first configuration pin and the voltage of the second configuration pin or the voltage of the third configuration pin and the voltage of the second configuration pin that are sampled when the second reference voltage is supplied to the configured resistor load by using the first configuration pin and the third configuration pin simultaneously. For example, the second voltage ratio may be equal to a ratio of the voltage of the second configuration pin to the voltage of the first configuration pin or the voltage of the third configuration pin, which are sampled when the second reference voltage is supplied to the configured resistor load by using the first configuration pin and the third configuration pin simultaneously. That is, the second voltage ratio is mod_ratio3=vmod2/vmod1=R2/(R2+R3/2).

S604. Determine a corresponding pin configuration state based on the first voltage ratio, the second voltage ratio, and the third voltage ratio.

In Embodiment 6, a corresponding pin configuration state is determined by combining the first voltage ratio, the second voltage ratio, and the third voltage ratio, and N×N×N states may also be configured. Compared with Embodiment 4, in Embodiment 6, although the structure of the configured resistor load is the same, a method in which the voltage sampling unit supplies the second reference voltage to the configured resistor load is different. As a result, a method of calculating the first voltage ratio, the second voltage ratio, and the third voltage ratio by the voltage ratio calculation unit is also different. Compared with Embodiment 4, in Embodiment 6, it is easier to select each resistor and a design range is wider. Therefore, configuration design is simpler.

Embodiment 7

Figure 23:
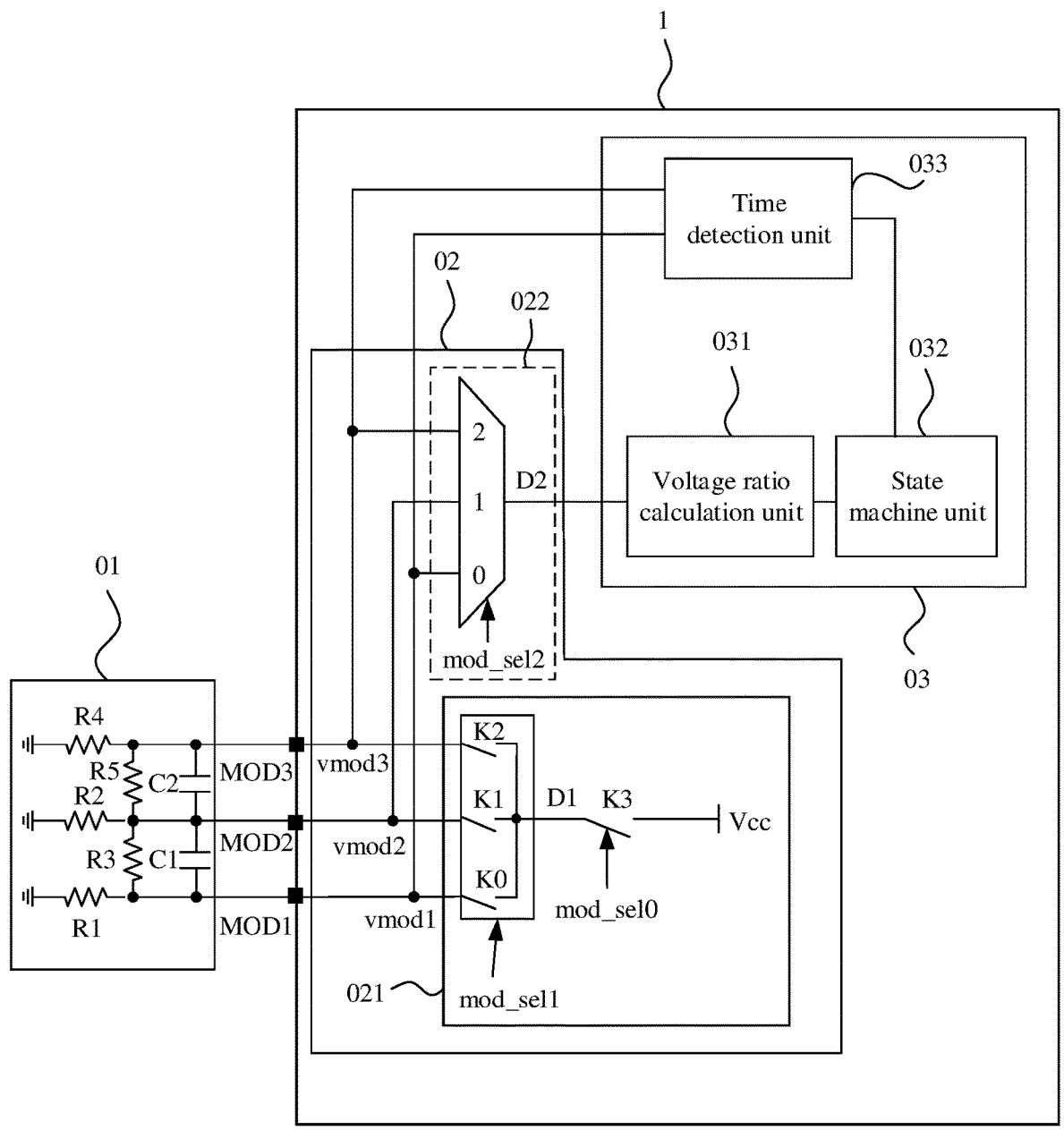
FIG. 23 is a schematic diagram of a structure of still another pin state configuration circuit according to an embodiment of this application.

For example, referring to FIG. 23, the configured resistor load 01 may further include a first capacitor C1 connected in parallel to the third resistor R3, and a second capacitor C2 connected in parallel to the fifth resistor R5. The comparator 03 may further include a time detection unit 033. The time detection unit 033 is configured to respectively detect a charging time or a discharging time of the first capacitor C1 and a charging time or a discharging time of the second capacitor C2 when the voltage sampling unit 02 supplies the second reference voltage Vcc to the configured resistor load 01. The state machine unit 032 is configured to determine a corresponding pin configuration state based on the first voltage ratio, the second voltage ratio, and the charging time or the discharging time of the first capacitor C1 and the charging time or the discharging time of the second capacitor C2 that are detected by the time detection unit 033.

Figure 24:
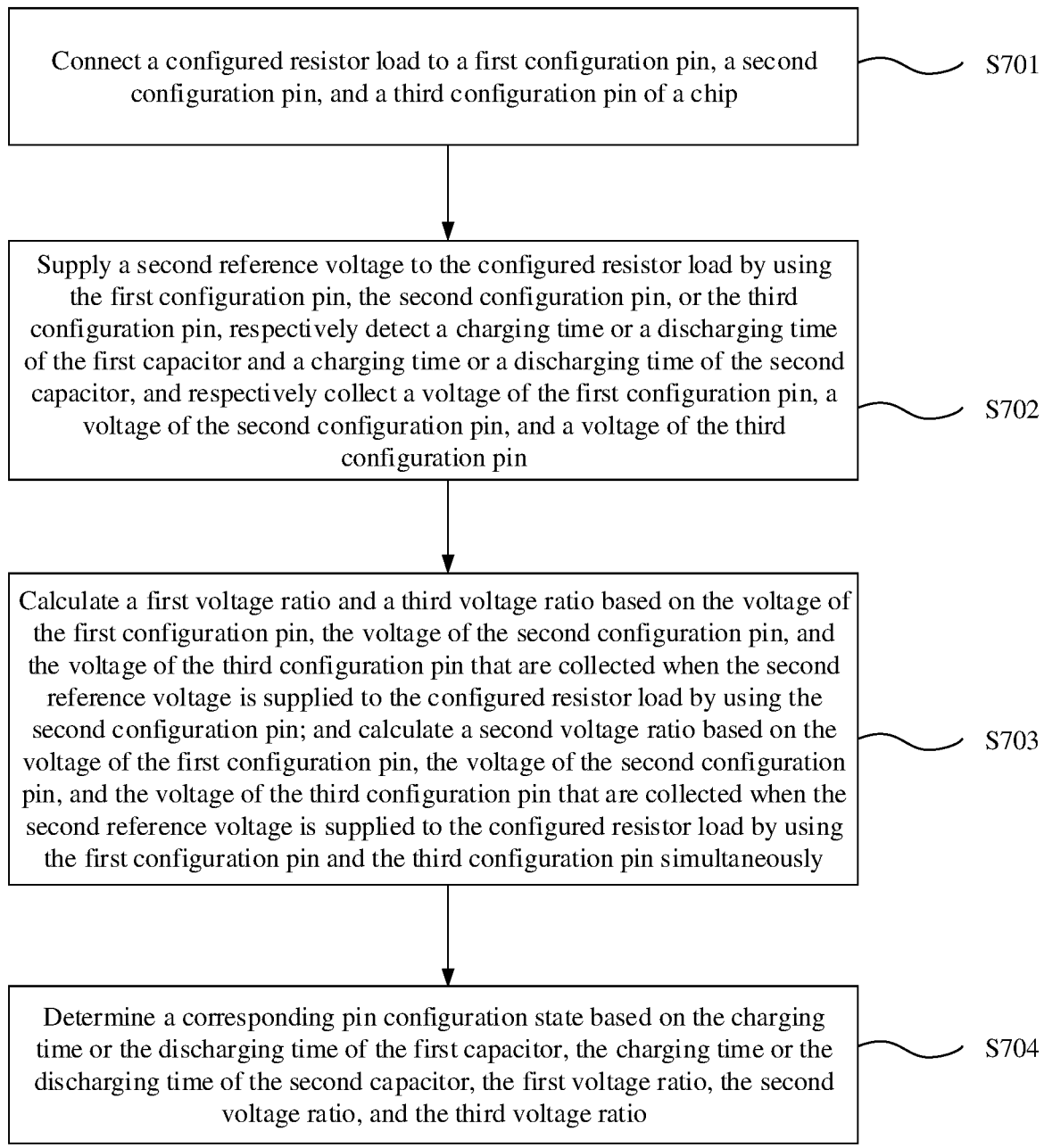
FIG. 24 is a schematic flowchart of a pin state configuration method according to Embodiment 7 of this application.

A configuration method corresponding to the configuration circuit shown in FIG. 23 is shown in FIG. 24, and may include the following steps.

S701. Connect the configured resistor load to the first configuration pin, the second configuration pin, and the third configuration pin of the chip.

S702. Supply a second reference voltage to the configured resistor load by using the first configuration pin, the second configuration pin, or the third configuration pin, respectively detect a charging time or a discharging time of the first capacitor and a charging time or a discharging time of the second capacitor, and respectively sample a voltage of the first configuration pin, a voltage of the second configuration pin, and a voltage of the third configuration pin.

In a specific implementation, when the second reference voltage is supplied to the configured resistor load by using the second configuration pin, the voltage of the first configuration pin, the voltage of the second configuration pin, and the voltage of the third configuration pin are respectively sampled. When the second reference voltage is supplied to the configured resistor load by using the first configuration pin and the third configuration pin simultaneously, the voltage of the first configuration pin, the voltage of the second configuration pin, and the voltage of the third configuration pin are respectively sampled.

In a specific implementation, the time detection unit 033 is respectively connected to the first configuration pin MOD1 and the third configuration pin MOD3. M states may be obtained by configuring a capacitance value of the first capacitor C1, and M states may be obtained by configuring a capacitance value of the second capacitor C2.

S703. Calculate a first voltage ratio and a third voltage ratio based on the voltage of the first configuration pin, the voltage of the second configuration pin, and the voltage of the third configuration pin that are sampled when the second reference voltage is supplied to the configured resistor load by using the second configuration pin; and calculate a second voltage ratio based on the voltage of the first configuration pin, the voltage of the second configuration pin, and the voltage of the third configuration pin that are sampled when the second reference voltage is supplied to the configured resistor load by using the first configuration pin and the third configuration pin simultaneously.

S704. Determine a corresponding pin configuration state based on the charging time or the discharging time of the first capacitor, the charging time or the discharging time of the second capacitor, the first voltage ratio, the second voltage ratio, and the third voltage ratio.

Compared with Embodiment 6, Embodiment 7 has the first capacitor, the second capacitor, and the time detection unit added. A corresponding pin configuration state may be determined by combining the charging time or the discharging time of the first capacitor, the charging time or the discharging time of the second capacitor, the first voltage ratio, the second voltage ratio, and the third voltage ratio, and N×N×N×M×M states may be configured. Values of N and M may be the same, or may be different. This is not limited herein.

Optionally, a quantity of configuration pins in the chip may be further increased, to further increase a quantity of states that can be configured for the chip. For example, when the quantity of configuration pins is an even number, the configured resistor load may include a plurality of π-type resistor topology structures shown in FIG. 3. For example, when the quantity of configuration pins is 4, the configured resistor load may be include two π-type resistor topology structures. When the quantity of configuration pins is 6, the configured resistor load may include three π-type resistor topology structures. When the quantity of configuration pins increases, the configured resistor load may be deduced by analogy. When the quantity of configuration pins is an odd number, one or more π-type resistor topology structures may be added to the configured resistor load based on Embodiment 4 or Embodiment 6. For example, when the quantity of configuration pins is 5, the configured resistor load may be formed by adding one n-type resistor topology structure to the configured resistor load configuration in Embodiment 4. When the quantity of configuration pins is 7, the configured resistor load may be formed by adding two π-type resistor topology structures to the configured resistor load in Embodiment 4. When the quantity of configuration pins increases, the configured resistor load may be deduced by analogy. In this application, one more configuration pin indicates that the quantity of states that can be configured may be increased N times.

Further, in embodiments of this application, the quantity of states that can be configured may be further increased by adding a capacitor to the configured resistor load. For cases in which a capacitor is added, refer to Embodiment 2, Embodiment 3, Embodiment 5, and Embodiment 7.

In conclusion, compared with the related technology, a precision of a state value can be improved through state configuration based on a resistor voltage division ratio. Second, more states can be configured by using two or more configuration pins. Finally, the configured resistor load in embodiments of this application does not work after the configuration is completed. Therefore, there is no power loss.

An embodiment of this application further provides an electronic device, including a chip and any one of the pin state configuration circuits provided in the embodiments of this application. The configuration circuit is configured to connect to configuration pins of the chip. Because a problem resolution principle of the electronic device is similar to that of the state configuration circuit, for implementation of the electronic device, refer to implementation of the state configuration circuit. Details are not repeated.

A person skilled in the art should understand that the embodiments of this application may be provided as methods, systems, or computer program products. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to this application. It should be understood that computer program instructions may be used to implement each procedure and/or each block in the flowcharts and/or the block diagrams and a combination of a procedure and/or a block in the flowcharts and/or the block diagrams. These computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more procedures in the flowcharts and/or in one or more blocks in the block diagrams.

These computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more procedures in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Obviously, a person skilled in the art can make various modifications and variations to this application without departing from the scope of this application. This application is intended to cover these modifications and variations of this application provided that they fall within the scope of protection defined by the following claims and their equivalent technologies.

The invention claimed is:

1. A pin state configuration circuit, comprising: a configured resistor load, a voltage sampling unit, and a comparator, wherein the configured resistor load is configured to connect to a first configuration pin and a second configuration pin of a chip;

the voltage sampling unit is configured to supply a first reference voltage to the configured resistor load by using the first configuration pin or the second configuration pin, and respectively sample a voltage of the first configuration pin and a voltage of the second configuration pin; and the comparator is configured to calculate a first voltage ratio based on the voltage of the first configuration pin and the voltage of the second configuration pin that are sampled by the voltage sampling unit when the first reference voltage is supplied to the configured resistor load by using the first configuration pin, calculate a second voltage ratio based on the voltage of the first configuration pin and the voltage of the second configuration pin that are sampled by the voltage sampling unit when the first reference voltage is supplied to the configured resistor load by using the second configuration pin, and determine a corresponding pin configuration state based on the first voltage ratio and the second voltage ratio.

2. The pin state configuration circuit according to claim 1, wherein the configured resistor load further comprises: a first resistor, a second resistor, and a third resistor, and the first resistor, the second resistor and the third resistor are configurable; and a first terminal of the first resistor is configured to connect to a second reference voltage, and a second terminal of the first resistor is configured to connect to the first configuration pin; a first terminal of the second resistor is configured to connect to the second reference voltage, and a second terminal of the second resistor is configured to connect to the second configuration pin; and the third resistor is connected between the second terminal of the first resistor and the second terminal of the second resistor.

3. The pin state configuration circuit according to claim 2, wherein the configured resistor load further comprises a first capacitor connected in parallel to the third resistor; and the comparator is further configured to detect a charging time or a discharging time of the first capacitor when the voltage sampling unit supplies the first reference voltage to the configured resistor load, to determine a corresponding pin configuration state based on the first voltage ratio, the second voltage ratio, and the charging time or the discharging time of the first capacitor.

4. The pin state configuration circuit according to claim 2, wherein the configured resistor load further comprises a first capacitor connected in parallel to the first resistor and a second capacitor connected in parallel to the second resistor; and the comparator is further configured to respectively detect a charging time or a discharging time of the first capacitor and a charging time or a discharging time of the second capacitor when the voltage sampling unit supplies the first reference voltage to the configured resistor load, to determine a corresponding pin configuration state based on the first voltage ratio, the second voltage ratio, the charging time or the discharging time of the first capacitor, and the charging time or the discharging time of the second capacitor.

5. The pin state configuration circuit according to claim 2, wherein the configured resistor load further comprises a fourth resistor and a fifth resistor, the fourth resistor and the fifth resistor being configurable; a first terminal of the fourth resistor is configured to connect to the second reference voltage, and a second terminal of the fourth resistor is configured to connect to a third configuration pin of the chip; and the fifth resistor is connected between the second terminal of the fourth resistor and the second terminal of the second resistor;
 the voltage sampling unit is further configured to sample a voltage of the third configuration pin when the first reference voltage is supplied to the configured resistor load by using the second configuration pin; and
 the comparator is further configured to calculate a third voltage ratio based on the voltage of the second configuration pin and the voltage of the third configuration pin that are sampled by the voltage sampling unit when the first reference voltage is supplied to the configured resistor load by using the second configuration pin, to determine a corresponding pin configuration state based on the first voltage ratio, the second voltage ratio, and the third voltage ratio.

6. The pin state configuration circuit according to claim 5, wherein the configured resistor load further comprises a first capacitor connected in parallel to the third resistor and a second capacitor connected in parallel to the fifth resistor; and
 the comparator is further configured to respectively detect a charging time or a discharging time of the first capacitor and a charging time or a discharging time of the second capacitor when the voltage sampling unit supplies the first reference voltage to the configured resistor load, to determine a corresponding pin configuration state based on the first voltage ratio, the second voltage ratio, the third voltage ratio, the charging time or the discharging time of the first capacitor, and the charging time or the discharging time of the second capacitor.

7. A pin state configuration circuit, comprising: a configured resistor load, a voltage sampling unit, and a comparator, wherein
 the configured resistor load is configured to connect to a first configuration pin, a second configuration pin, and a third configuration pin of a chip;
 the voltage sampling unit is configured to supply a first reference voltage to the configured resistor load by using the second configuration pin, and respectively sample a voltage of the first configuration pin, a voltage of the second configuration pin, and a voltage of the third configuration pin; and supply the first reference voltage to the configured resistor load by using the first configuration pin and the third configuration pin simultaneously, and respectively sample the voltage of the first configuration pin, the voltage of the second configuration pin, and the voltage of the third configuration pin; and
 the comparator is configured to calculate a first voltage ratio and a third voltage ratio based on the voltage of the first configuration pin, the voltage of the second configuration pin, and the voltage of the third configuration pin that are sampled by the voltage sampling unit when the first reference voltage is supplied to the configured resistor load by using the second configuration pin; calculate a second voltage ratio based on the voltage of the first configuration pin, the voltage of the second configuration pin, and the voltage of the third configuration pin that are sampled by the voltage sampling unit when the first reference voltage is supplied to the configured resistor load by using the third configuration pin and the first configuration pin simultaneously; and determine a corresponding pin configuration state based on the first voltage ratio, the second voltage ratio, and the third voltage ratio.

8. The pin state configuration circuit according to claim 7, wherein the configured resistor load further comprises: a first resistor, a second resistor, a third resistor, a fourth resistor, and a fifth resistor, and the first resistor, the second resistor, the third resistor, the fourth resistor and the fifth resistor are configurable; and
 a first terminal of the first resistor is configured to connect to a second reference voltage, and a second terminal of the first resistor is configured to connect to the first configuration pin; a first terminal of the second resistor is configured to connect to the second reference voltage, and a second terminal of the second resistor is configured to connect to the second configuration pin; the third resistor is connected between the second terminal of the first resistor and the second terminal of the second resistor; a first terminal of the fourth resistor is configured to connect to the second reference voltage, and a second terminal of the fourth resistor is configured to connect to the third configuration pin; and the fifth resistor is connected between the second terminal of the fourth resistor and the second terminal of the second resistor.

9. The pin state configuration circuit according to claim 8, wherein the configured resistor load further comprises a first capacitor connected in parallel to the third resistor and a second capacitor connected in parallel to the fifth resistor; and
 the comparator is further configured to respectively detect a charging time or a discharging time of the first capacitor and a charging time or a discharging time of the second capacitor when the voltage sampling unit supplies the first reference voltage to the configured resistor load, to determine a corresponding pin configuration state based on the first voltage ratio, the second voltage ratio, the third voltage ratio, the charging time or the discharging time of the first capacitor, and the charging time or the discharging time of the second capacitor.

10. An electronic device, comprising a chip and a pin state configuration circuit, wherein the pin state configuration circuit is configured to connect to configuration pins of the chip, the pin state configuration circuit comprising: a configured resistor load, a voltage sampling unit, and a comparator,
 wherein the configured resistor load is configured to connect to a first configuration pin and a second configuration pin of a chip;
 the voltage sampling unit is configured to supply a first reference voltage to the configured resistor load by using the first configuration pin or the second configuration pin, and respectively sample a voltage of the first configuration pin and a voltage of the second configuration pin; and
 the comparator is configured to calculate a first voltage ratio based on the voltage of the first configuration pin and the voltage of the second configuration pin that are sampled by the voltage sampling unit when the first reference voltage is supplied to the configured resistor load by using the first configuration pin, calculate a second voltage ratio based on the voltage of the first configuration pin and the voltage of the second configuration pin that are sampled by the voltage sampling unit when the first reference voltage is supplied to the configured resistor load by using the second configuration pin, and determine a corresponding pin configuration state based on the first voltage ratio and the second voltage ratio.

11. The electronic device according to claim 10, wherein the configured resistor load further comprises: a first resistor, a second resistor, and a third resistor, and the first resistor, the second resistor and the third resistor are configurable; and a first terminal of the first resistor is configured to connect to a second reference voltage, and a second terminal of the first resistor is configured to connect to the first configuration pin; a first terminal of the second resistor is configured to connect to the second reference voltage, and a second terminal of the second resistor is configured to connect to the second configuration pin; and the third resistor is connected between the second terminal of the first resistor and the second terminal of the second resistor.

12. The electronic device according to claim 11, wherein the configured resistor load further comprises a first capacitor connected in parallel to the third resistor; and the comparator is further configured to detect a charging time or a discharging time of the first capacitor when the voltage sampling unit supplies the first reference voltage to the configured resistor load, to determine a corresponding pin configuration state based on the first voltage ratio, the second voltage ratio, and the charging time or the discharging time of the first capacitor.

13. The electronic device according to claim 11, wherein the configured resistor load further comprises a first capacitor connected in parallel to the first resistor and a second capacitor connected in parallel to the second resistor; and the comparator is further configured to respectively detect a charging time or a discharging time of the first capacitor and a charging time or a discharging time of the second capacitor when the voltage sampling unit supplies the first reference voltage to the configured resistor load, to determine a corresponding pin configuration state based on the first voltage ratio, the second voltage ratio, the charging time or the discharging time of the first capacitor, and the charging time or the discharging time of the second capacitor.

14. The electronic device according to claim 11, wherein the configured resistor load further comprises a fourth resistor and a fifth resistor, the fourth resistor and the fifth resistor being configurable; a first terminal of the fourth resistor is configured to connect to the second reference voltage, and a second terminal of the fourth resistor is configured to connect to a third configuration pin of the chip; and the fifth resistor is connected between the second terminal of the fourth resistor and the second terminal of the second resistor;

the voltage sampling unit is further configured to sample a voltage of the third configuration pin when the first reference voltage is supplied to the configured resistor load by using the second configuration pin; and the comparator is further configured to calculate a third voltage ratio based on the voltage of the second configuration pin and the voltage of the third configuration pin that are sampled by the voltage sampling unit when the first reference voltage is supplied to the configured resistor load by using the second configuration pin, to determine a corresponding pin configuration state based on the first voltage ratio, the second voltage ratio, and the third voltage ratio.

15. The electronic device according to claim 14, wherein the configured resistor load further comprises a first capacitor connected in parallel to the third resistor and a second capacitor connected in parallel to the fifth resistor; and the comparator is further configured to respectively detect a charging time or a discharging time of the first capacitor and a charging time or a discharging time of the second capacitor when the voltage sampling unit supplies the first reference voltage to the configured resistor load, to determine a corresponding pin configuration state based on the first voltage ratio, the second voltage ratio, the third voltage ratio, the charging time or the discharging time of the first capacitor, and the charging time or the discharging time of the second capacitor.

* * * * *